United States Patent
Shany et al.

(10) Patent No.: US 12,413,252 B2
(45) Date of Patent: Sep. 9, 2025

(54) FAST COMBINED CHASE AND GMD DECODING OF GENERALIZED REED-SOLOMON CODES

(71) Applicant: SAMSUNG ELECTRONICS CO., LTD., Suwon-si (KR)

(72) Inventors: Yaron Shany, Kfar Saba (IL); Ariel Doubchak, Herzliya (IL); Idan Dekel, Tel Aviv (IL); Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/396,102

(22) Filed: Dec. 26, 2023

(65) Prior Publication Data

US 2025/0211257 A1 Jun. 26, 2025

(51) Int. Cl.
*H03M 13/45* (2006.01)
*H03M 13/15* (2006.01)

(52) U.S. Cl.
CPC ....... *H03M 13/453* (2013.01); *H03M 13/154* (2013.01); *H03M 13/1515* (2013.01)

(58) Field of Classification Search
CPC .......................... H03M 13/453; H03M 13/154
See application file for complete search history.

(56) References Cited

U.S. PATENT DOCUMENTS

| 8,245,117 B1 * | 8/2012 | Wu .................. H03M 13/1515 714/781 |
| 10,404,407 B2 | 9/2019 | Shany et al. |
| 2019/0068319 A1 * | 2/2019 | Shany ................. H03M 13/153 |

OTHER PUBLICATIONS

Y. Shany and A. Berman, "A Grobner-Bases Approach to Syndrome-Based Fast Chase Decoding of Reed-Solomon Codes," in IEEE Transactions on Information Theory, vol. 68, No. 4, pp. 2300-2318, Apr. 2022, doi: 10.1109/TIT.2022.3140678. (Year: 2022).*

Y. Wu, "Fast Chase Decoding Algorithms and Architectures for Reed-Solomon Codes," in IEEE Transactions on Information Theory, vol. 58, No. 1, pp. 109-129, Jan. 2012, doi: 10.1109/TIT.2011.2165524. (Year: 2012).*

(Continued)

*Primary Examiner* — Joseph D Torres
(74) *Attorney, Agent, or Firm* — Morgan, Lewis & Bockius LLP

(57) ABSTRACT

A method for soft decoding of generalized Reed-Solomon (RS) error correction codes, includes receiving a codeword through a digital electronic communication channel; verifying that an HD error-and-erasures decoding has failed; finding a Groebner basis that accounts for a fixed set of erasures; constructing a Chase and GMD decoding tree on the set of Chase coordinates and the set of GMD coordinates; traversing the decoding tree using polynomials of the Groebner basis as a basis that represents updated coefficient polynomials on the Chase and GMD decoding tree; updating polynomials on the decoding tree using root and derivate steps that flip an edge, or a root step for an erasure edge; calculating error locations by polynomial evaluation of candidate polynomials from the decoding tree, and calculating error values by using Forney's formula; and correcting the received codeword according to the calculated error locations and calculated error values.

20 Claims, 3 Drawing Sheets

(56) References Cited

OTHER PUBLICATIONS

Yaron Shany and Amit Berman; "Fast syndrome-based Chase decoding of binary BCH codes through Wu list decoding"; IEEE Transactions on Information Theory, vol. 69, Issue 8; Aug. 1, 2023 (Year: 2023).*

J. Bellorado and A. Kavcic, "Low-complexity soft decoding algorithms for Reed-Solomon codes: Part I—An algebraic soft-in-hard-out Chase decoder," IEEE Trans. Inform. Theory, vol. 56, No. 3, pp. 945-959, Mar. 2010.

R. E. Blahut, Algebraic Codes for Data Transmission. CUP, 2003.

D. Chase, "A class of algorithms for decoding block codes with channel measurement information," IEEE Trans. Inform. Theory, vol. IT-18, No. 1, pp. 170-182, Jan. 1972.

P. Fitzpatrick, "On the key equation," IEEE Trans. Inform. Theory, vol. 41, No. 5, pp. 1290-1302, Sep. 1995.

D. A. Cox, J. Little, and D. O'Shea, Using Algebraic Geometry. Springer, 2nd Ed., 2005.

G. D. Forney, "Generalized minimum distance decoding," IEEE Trans. Inform. Theory, vol. IT-12, No. 2, pp. 125-131, Apr. 1966.

V. Guruswami and M. Sudan, "Improved decoding of Reed-Solomon and algebraic-geometry codes," IEEE Trans. Inform. Theory, vol. 45, No. 6, pp. 1757-1767, Sep. 1999.

R. Koetter, "Fast generalized minimum-distance decoding of algebraic-geometry and Reed-Solomon codes," IEEE Trans. Inform. Theory, vol. 42, No. 3, pp. 721-737, May 1996.

R. Koetter and A. Vardy, "Algebraic soft-decision decoding of Reed-Solomon codes," IEEE Trans. Inform. Theory, vol. 49, No. 11, pp. 2809-2825, Nov. 2003.

R. J. McEliece, The Theory of Information and Coding. CUP, 2004.

R. J. McEliece, "The Guruswami-Sudan decoding algorithm for Reed-Solomon codes," IPN progress report, vol. 42-153, May 2003.

R. M. Roth, Introduction to Coding Theory, CUP, 2006.

Y. Shany and A. Berman, "A Groebner-bases approach to syndrome-based fast Chase decoding of Reed-Solomon codes," IEEE Trans. Inform. Theory, vol. 68, No. 4, pp. 2300-2318, Apr. 2022.

H. Tang, Y. Liu, M. Fossorier, and S. Lin, "On combining Chase-2 and GMD decoding algorithms for nonbinary block codes," IEEE Commun. Letters, vol. 5, No. 5, pp. 209-211, May 2001.

Y. Wu, "Fast Chase decoding algorithms and architectures for Reed-Solomon codes," IEEE Trans. Inform. Theory, vol. 58, No. 1, pp. 109-129, Jan. 2012.

Ur-Rehman, et al., "Soft decision iterative error and erasure decoder for Reed-Solomon codes", in IET Communications, Jun. 26, 2014, vol. 8, Iss. 16, doi: 10.1049/iet-com.2014.0033, found on the internet at www.ietdl.org, pp. 2863-2870.

Shany, Y., et al., "A Grobner-bases approach to syndrome-based fast Chase decoding of Reed-Solomon codes", Jan. 4, 2022, pp. 1-46.

\* cited by examiner

FAST COMBINED CHASE AND GMD DECODING OF GENERALIZED REED-SOLOMON CODES

TECHNICAL FIELD

Embodiments of the disclosure are directed to new efficient methods for soft decoding of Reed-Solomon (RS) codes.

DISCUSSION OF THE RELATED ART

Reed-Solomon codes are a group of error correction codes that are widely used in various applications. RS codes are widely used in communication and storage systems. In some applications, RS codes are used as part of a generalized concatenated codes (GCC) scheme. In such schemes, RS codes are decoded for both errors and erasures, where errors for the RS codes correspond to undetected errors in row codes, while erasures for the RS codes correspond to detected errors in the row codes. Some list decoding algorithms that can reduce the probability of decoding error in comparison to that of plain errors-and-erasures decoding. Regarding algebraic soft decoding, a significant gain in decoding performance can be achieved by using soft information, i.e., probabilistic information on the received symbols: instead of simply using the single a posteriori most probable finite-field element at each coordinate as the decoder input, the decoder may benefit from knowing the a posteriori probability for each finite field element (or an approximation thereof), for each coordinate.

SUMMARY

According to an embodiment of the disclosure, there is provided a method for soft decoding of generalized Reed-Solomon (RS) error correction codes. The method includes receiving a codeword y through a digital electronic communication channel, wherein y=x+e for at least one error vector $e \in F_q^n$, where $F_q$ is a finite field of q elements, wherein q is a prime power, and for transmitted codeword $x \in C$, wherein C is a generalized Reed-Solomon code of length $n<=q-1$ and that is configured to be shortened and minimum Hamming distance $d \geq 2$; performing hard decision (HD) error-and-erasures decoding on the codeword with a fixed set of erasures; verifying that the HD error-and-erasures decoding has failed; finding a Groebner basis to a solution module that accounts for a fixed set of erasures; determining a set of Chase coordinates and a set of generalized minimum distance (GMD) coordinates using channel reliability information; constructing a Chase and GMD decoding tree on the set of Chase coordinates and the set of GMD coordinates; traversing the decoding tree depth first using polynomials of the Groebner basis as a basis that represents updated coefficient polynomials on the Chase and GMD decoding tree; updating polynomials on the decoding tree using root and derivate steps that flip an edge, or a root step for an erasure edge; calculating error locations by polynomial evaluation of candidate polynomials from the decoding tree, and calculating error values; and correcting the received codeword according to the calculated error locations and calculated error values, and saving the corrected received codeword to a decoder output list.

According to a further embodiment of the disclosure, performing hard decision (HD) error-and-erasures decoding with a fixed set of erasures includes calculating an estimated error location polynomial (ELP) v(X) that excludes erasures by performing an errors and erasures Berlekamp-Massey algorithm, where X is an indeterminate variable; verifying that v(X) has deg(v(X)) inverses of roots on coordinates $F_q^* \backslash A_1'$ that are not fixed erasures, wherein $F_q^* := F_q \backslash \{0\}$ and $A_1'$ is a set of fixed erasures, and that $\deg(v)=L-e_0^{(1)}$, wherein L is an estimated order, $e_0^{(1)}$ is a number of fixed erasures and $L-e_0^{(1)}$ is a corrected order that excludes erasures; defining $\sigma_1:=v$; calculating an errors and fixed erasures ELP $\sigma_E:=\sigma_1 \sigma_0^{(1)}$, wherein $\sigma_0^{(1)}$ is an erasure locating polynomial, and an errors and fixed erasures error evaluation polynomial (EEP) $\omega_E = \tilde{S}\sigma_1 \mod (X^{d-1})$, wherein $\tilde{S}$ is a syndrome polynomial associated with y and the set of fixed erasures; finding error values for error locations outside $A_1'$, by using Forney's formula with roots of $\sigma_1$; and error values for error locations in $A_1'$, by using Forney's formula with the inverses of elements of $A_1'$; correcting all errors in a decoded codeword using the found error values; and outputting a corrected decoded codeword.

According to a further embodiment of the disclosure, verifying that the HD error-and-erasures decoding has failed comprises verifying that v(X) does not have deg(v(X)) roots on inverses of non-erased coordinates, or that $\deg(v) \neq L - e_0^{(1)}$.

According to a further embodiment of the disclosure, constructing a decoding tree includes assigning memory for $r_{max}+1$ Groebner bases, one for each depth, where $r_{max}$ is a maximum designed depth, and storing the Groebner basis $\{(1,0), (0,1)\}$ for a module of coefficient polynomials $$N_{0,e_0^{(1)},0}$$

for a case of only fixed ensures in a memory of depth 0, wherein the decoding tree includes a root that is an all zero vector in $F_2^n$, vertices that at depth r, for all $r \in \{1, \ldots, r_{max}\}$, are vectors of length n and weight r in $F_2^n$, and edges that are pairs ($\beta'$, $\beta$), wherein $\eta$ is a number of Chase flipping coordinates plus a number of variable GMD erasure coordinates, wherein for each vertex $\beta = (\beta_1, \ldots, \beta_n) \in F_2^n$ at depth r with non-zero entries at coordinates $i_1, \ldots, i_r$, a single vertex $\beta' = (\beta'_1, \ldots, \beta'_n)$ is selected at depth r−1 that is equal to $\beta$ on all coordinates, except for one additional flipped or erased coordinate $i_\ell$, $\ell \in \{1, \ldots, r\}$ in an edge, for which $\beta'_{i_\ell} = 0$.

According to a further embodiment of the disclosure, traversing the decoding tree depth first comprises updating a Groebner basis read from a memory of a previous depth when moving on an edge that corresponds to one additional variable erasure or one additional Chase flip, wherein the updated Groebner basis is stored in memory.

According to a further embodiment of the disclosure, updating the Groebner basis read from the memory of the previous depth comprises using Koetter's iteration that deletes an additional coordinate when moving on an edge that corresponds to one additional variable erasure or using a pair of Koetter's iterations when moving on an edge that corresponds to a Chase flip on an additional coordinate.

According to a further embodiment of the disclosure, the method includes verifying that, during an update of the Groebner basis, a stopping condition holds; outputting that the stopping condition was falsely positive, and returning to the depth-first search of the tree, when the number of roots of $\hat{\sigma}$ whose inverses are not on a fixed or variable erasure is not deg($\hat{\sigma}$)-$e_0^{(2)}$, wherein $\hat{\sigma}$ is a set of estimated errors and variable erasures ELP, and $e_0^{(2)}$ is a number of variable erasures.

According to a further embodiment of the disclosure, the method includes verifying that, during an update of the Groebner basis, a stopping condition holds; outputting that the stopping condition was falsely positive, and returning to the depth-first search on the tree, when at least one of error values found on coordinates with locators in the non-erased coordinates $F_q^* \setminus (A_1' \cup A_2')$ equal 0, wherein $F_q^* := F_q \setminus \{0\}$, $A_1'$ is a set of fixed erasures and $A_2'$ is a current hypothesis of variable erasures.

According to a further embodiment of the disclosure, calculating error locations by polynomial evaluation of candidate polynomials from the decoding tree, and calculating error values by using Forney's formula, includes verifying that a valid pair of EEP and ELP has been found by checking that a number of ELP roots equals its degree minus a number of variables erasures, and the inverses of all roots are outside a fixed erasure set, finding error values on non-erased coordinates using Forney's algorithm with the EEP and ELP, and checking that no estimated error value on a non-erased coordinate is zero; calculating an estimated errors and erasures ELP $\hat{\sigma_E} := \hat{\sigma} \cdot \sigma_0^{(1)}$, wherein $\hat{\sigma}$ is a set of estimated errors and variable erasures ELP and $\sigma_0^{(1)}$ is a fixed erasures ELP, and finding error values only on coordinates with locators in $F_q^* \setminus (A_1' \cup A_2')$ by using Forney's formula, wherein $F_q^* := F_q \setminus \{0\}$, $A_1'$ is a set of fixed erasures and $A_2'$ is a current hypothesis of variable erasures and calculating error values for all $e_0^{(1)} + e_0^{(2)}$ erased coordinates by using Forney's formula, wherein $e_0^{(2)}$ is a number of variable erasures.

According to a further embodiment of the disclosure, finding all the roots of $\hat{\sigma}$ on inverses of elements from $F_q^* \setminus (A_1' \cup A_2')$ includes evaluating and storing values of $h_{01}(\beta)$, $h_{11}(\beta)$, $h_{01}'(\beta)$, and $h_{11}'(\beta)$ for all coordinates $\beta \in F_q^*$, wherein $h_{01}$ and $h_{11}$ are second polynomials from of the Groebner basis of the solution module for an errors and fixed erasures key equation; calculating $\hat{\sigma}(\beta) = f_{10}(\beta) \cdot h_{01}(\beta) + f_{11}(\beta) \cdot h_{11}(\beta)$ for a new set of estimated errors $\hat{\sigma}$, wherein $f_{10}$ and $f_{11}$ are individual polynomials from the current Groebner basis for the solution module of coefficient polynomials; and calculating a derivative of the ELP $\hat{\sigma}'(\beta)$ by evaluating derivatives $f_{10}'(\beta)$, $f_{11}'(\beta)$, and calculating $\sigma'(\beta)$ using 4 additional multiplications, using calculated and stored values and a following formula for an estimated value of $\hat{\sigma}'(X)$:
$\hat{\sigma}'(X) = f_{10}(X) h_{01}'(X) + f_{10}'(X) h_{01}(X) + f_{11}(X) h_{11}'(X) + f_{11}'(X) h_{11}(X)$.

According to another embodiment of the disclosure, there is provided a digital electronic circuit, tangibly embodying a program of instructions executed by the digital electronic circuit to perform method steps for soft decoding of generalized Reed-Solomon (RS) error correction codes.

DETAILED DESCRIPTION

Figure 1:
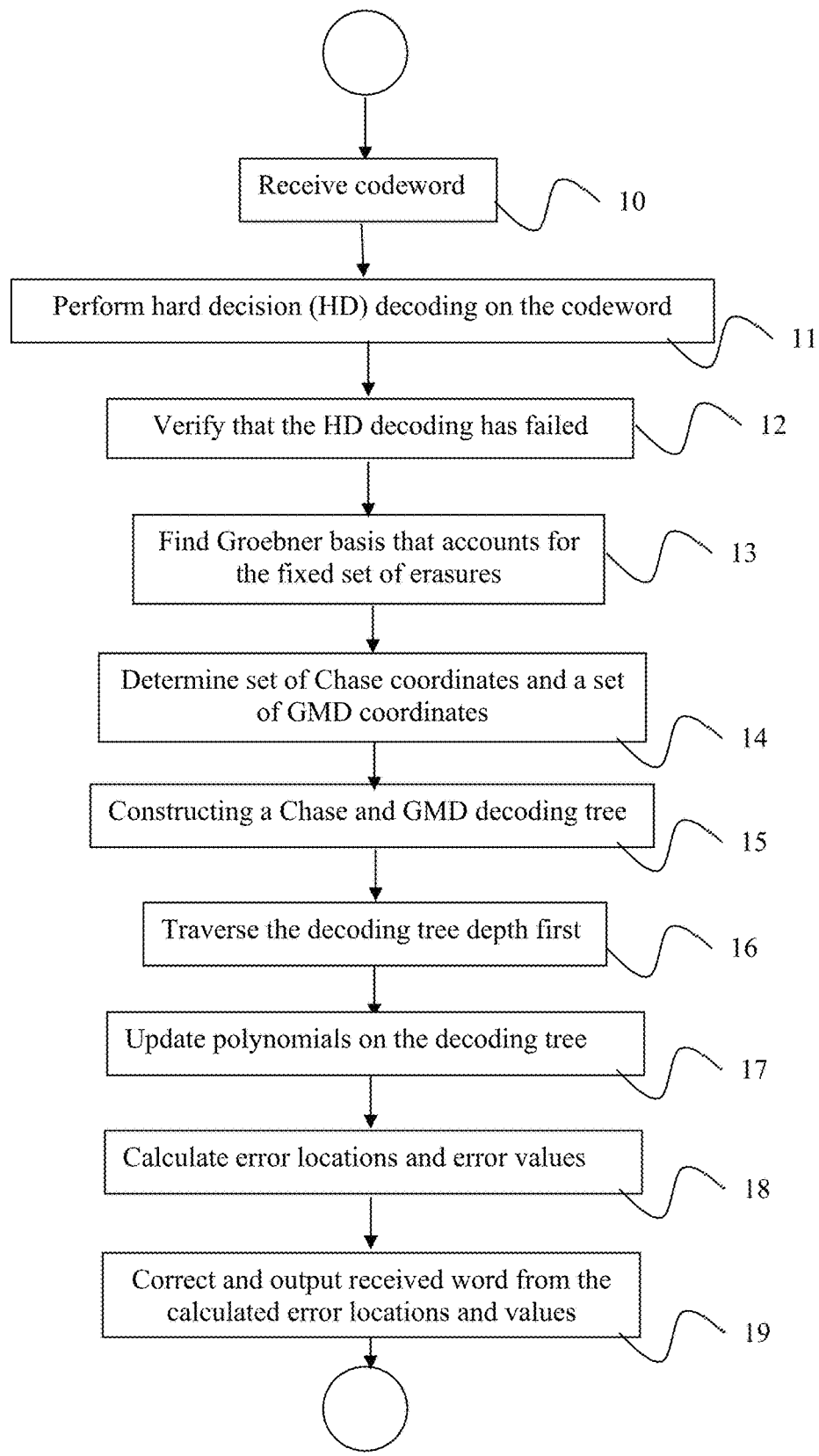
FIG. 1 is a flow chart of a decoding process with a new combined fast Chase/GMD algorithm according to an embodiment.

Embodiments of the disclosure are directed to a new method for fast combined Chase and GMD decoding of generalized RS (GRS) codes, including RS codes as a special case. The invention builds on, and extends, previous fast Chase decoding algorithms which did not consider combining fast GMD with the fast Chase decoding.

The main soft decoding algorithms for block codes were the generalized minimum distance (GMD) decoding, and the Chase decoding algorithms. GMD decoding includes repeated applications of errors-and-erasures decoding, while successively erasing an even number of the least reliable coordinates.

In Chase decoding, there is some pre-determined list of test error patterns on the n least reliable coordinates for some small $\eta$, where typically, $\eta \leq [d/2]$, and d is the minimum Hamming distance of the code. For example, this list may include all possible non-zero vectors, all vectors of a low enough weight, a pre-defined number of random vectors, etc. The decoder successively runs on error patterns from the list. Each such error pattern is subtracted from the received codeword, and the result is fed to a hard-decision (HD) decoder. If the HD decoder succeeds, then its output is saved into the output list of the decoder.

Note, however, that despite the exponential nature of Chase decoding, for high-rate codes of moderate length, it is known to have a better complexity/performance tradeoff than the algebraic soft decoding. For this reason, Chase decoding of RS codes is still of great interest.

When the finite-field size q grows, the complexity of $O(q^n)$ for Chase decoding scanning over all test error patterns from $F_q^n$, where $F_q$ is the finite field of q elements underlying the RS code, for a prime power q, becomes infeasible. For this reason, to scan only on, say, the 2 most-likely noise symbols for each coordinate. Note that by the definition of the HD symbol as the most likely symbol, one of these 2 most-likely noise symbols is always 0. Note also that this is equivalent to scanning on the 2 most likely values of the codeword coordinate.

The exponential complexity of Chase decoding is much higher than the linear complexity of GMD. However, the decoding performance of Chase decoding is typically much better than that of GMD. It is possible to combine Chase and GMD decoding: for some unreliable coordinates, the decoder runs on test error patterns (Chase), while for other unreliable coordinates, only erasure attempts are carried out (GMD).

A possible criterion for selecting the coordinates on which GMD is performed and the coordinates on which Chase is performed in combined Chase and GMD decoding appears.

For example, the set $I_{chase}$ of $\eta_{chase}$ coordinates on which Chase trials are performed can be defined by taking the $\eta_{chase}$ coordinates $i \in \{0, \ldots, n-1\}$ for which $$\rho_i^{(1)} := \log \frac{p(r_i \mid s_i(1)) + \sum_{j=M+1}^{q} p(r_i \mid s_i(j))}{\sum_{j=2}^{M} p(r_i \mid s_i(j))}$$

takes the $\eta_{chase}$ lowest values, where $(r_0, \ldots, r_{n-1})$ is the channel output, $s_i(j)$ is the j-th most likely symbol for the i-th received coordinate, where $i \in \{0, \ldots, n-1\}$ and $j \in \{1, \ldots, q\}$, and M is the number of most likely symbols considered in a Chase coordinate, typically, M=2. In addition, the set $I_{GMD}$ of $\eta_{GMD}$ coordinates on which GMD decoding is performed can also be defined by taking those coordinates i outside the above $\eta_{chase}$ coordinates for which $$\rho_i^{(2)} := \log \frac{p(r_i \mid s_i(1))}{\sum_{j=2}^{q} p(r_i \mid s_i(j))}$$

takes the $\eta_{GMD}$ lowest values.

To get an intuitive idea on such criterions, recall that in a possible simplified Chase decoding, only the 2 most likely symbols out of q possible symbols are scanned. This method is reasonable if the posterior probabilities of the remaining q−2 symbols are (loosely speaking) considerably smaller than those of the 2 most likely symbols.

If, for example, in some coordinate, all q−1 symbols other than the HD symbol, which is the most likely symbol, have similar posterior probabilities, then there is no clear choice for the second most likely symbol in the coordinate. If such a coordinate is considered unreliable, it is better to try to erase it than to search over all q−1 potential replacements.

In fast Chase decoding algorithms, the decoder shares computations between HD decodings of different test error patterns. For example, if two test error patterns differ on a single coordinate, it seems reasonable that there is no need to go through all steps of HD decoding twice. Similarly, in fast GMD algorithms, whenever additional erasures are added, instead of starting an entirely new errors-and-erasures decoding, the decoder uses the previous decoding output as a starting point.

Embodiments of the disclosure support two types of erasures: (1) Static erasures, present throughout all Chase and GMD trials, such as in the context of decoding GCC codes, static erasures correspond to detected errors in row codes, and (2) Dynamic erasures, added in the GMD decoding. The reason for supporting two types of erasures is for maximizing the efficiency of an algorithm according to an embodiment. Loosely speaking, static erasures are "taken out" of updated polynomials to avoid updating polynomials of high degree, especially when the number of static erasures is high, and then taken back into account at the end of the combined Chase/GMD process.

Embodiments of the disclosure make use of update rules: given an error locator polynomial (ELP) updated for GMD erasures and Chase-modified coordinates so far, embodiments of the disclosure provide a low-complexity method to update the ELP for the next GMD erasure/Chase-modified coordinate. The fast combined Chase and GMD decoding then arranges the scanned errors/erasures on a tree, described below, and uses the update rules on the edges of the tree.

GRS Codes and the Key Equation

Let q be a prime power, and let $F_q$ be the finite field of q elements. Consider a primitive generalized Reed-Solomon code (GRS) code, C, of length $\eta := q-1$ and minimum Hamming distance $d \geq 2$. For example, let $\tilde{a} = (\tilde{a}_0, \ldots, \tilde{a}_{n-1}) \in (F_q^*)^n$ be a vector of non-zero elements (where $F_q^* := F_q \setminus \{0\}$). For a vector $f = (f_0, \ldots, f_{n-1}) \in F_q^n$, let $f(X) := f_0 + f_1 X + \ldots + f_{n-1} X^{n-1} \in F_q[X]$. Now $C \subseteq F_q^n$ is defined as the set of all vector $f \in F_q^n$ for which $\tilde{a}(X) \odot f(X)$ has roots $1, \lambda, \ldots, \lambda^{d-2}$ for some fixed primitive $\lambda \in F_q$, where (—⊙—) stands for coefficient-wise multiplication of polynomials. Note that when $\tilde{a}_0 = \tilde{a}_1 = \ldots = \tilde{a}_{n-1}$, C is a Reed-Solomon (RS) code. Note also that there is no loss of generality in considering a primitive GRS code, as the more general case may be obtained by shortening a primitive GRS code. In the remainder of this document, $\tilde{a}$ will be referred to as the GRS scaling vector.

To recall the key equation, suppose that a codeword $x \in C$ is transmitted, and the received codeword is $y = x + e$ for at least one error vector $e \in F_q^n$. For $j \in \{0, \ldots, d-2\}$, let $S_j = s_j^{(y)} := (\tilde{a}(X) \odot y(X))(\lambda^j)$. The syndrome polynomial associated with y is $S^{(y)}(X) := S_0 + S_1 X + \ldots + S_{d-2} X^{d-2}$. By the definition of the GRS code, the same syndrome polynomial is associated with e.

A full set of error locaters for e is a subset $E \subseteq F_q^*$ such that for all $i \in \{0, \ldots, n-1\}$, $$i \in \text{supp}(e) \Rightarrow \lambda^i \in E,$$

where $\text{supp}(e) := \{i \in \{0, \ldots, n-1\} \mid e_i \neq 0\}$. So, for E to be a full set of error locators, it must contain all field elements pointing to error locations, and it is also allowed to contain additional elements. For example, $E = F_q^*$ is always a full set of error locators, but it is not a useful one, as will be clear below.

Let $\varepsilon$ be the total number of errors, i.e., the number of non-zero coordinates in e. Let $E = \{\alpha_1, \ldots, \alpha_{\varepsilon'}\} \subseteq F_q^*$ be a full set of error locators, where $\varepsilon' \geq \varepsilon$, and let the corresponding (possibly zero) error values be $\beta_1, \ldots, B_{\varepsilon'} \in F_q$. Define the error locator polynomial (ELP) associated with E, $\sigma_E(X) \in F_q[X]$ by setting $\sigma_E(X) := \Pi_{i=1}^{\varepsilon'}(1-\alpha_i X)$, and the error evaluator polynomial (EEP) associated with E, $\omega_E(X) \in F_q[X]$, by setting $\omega_E(X) := \Sigma_{i=1}^{\varepsilon'} \beta_i a_i \Pi_{j \neq i}(1-\alpha_j X)$, where $a_i := \tilde{a}_{i'}$ for the unique $i' \in \{0, \ldots, n-1\}$ with $\alpha_i = \lambda^{i'}$. Then the ELP, EEP, and syndrome polynomial satisfy the following key equation:

$$\omega_E \equiv S^{(y)} \sigma_E \mod(X^{d-1})$$

Another useful equation is Forney's formula, which relates the error locations and error values, and reads $$\beta_j = -\frac{\alpha_j \omega_E(\alpha_j^{-1})}{a_j \sigma'_E(\alpha_j^{-1})}$$

for all $j \in \{1, \ldots, \varepsilon'\}$.

Errors and Erasures Decoding

Before proceeding further, it will be useful to recall some facts regarding "plain" errors and erasures decoding of GRS codes.

Suppose that $e_0$ coordinates of the received vector y are erased. Let $\tilde{y} \in F_q^n$ be any vector that agrees with y on the non-erased coordinates. For example, $\tilde{y}$ is obtained from y by filling arbitrary values on the erased coordinates, for example, these arbitrary values can be all zero, and write $\tilde{e} := \tilde{y} - x$. The errors- and erasures decoder finds the locations and values of the non-zero entries of $\tilde{e}$, thus restoring x.

Let $J \subseteq \{0, \ldots, n-1\}$ be the set of non-erased coordinates, so that $|J| = n - e_0$. Let $E_1$ be the set of locators of all errors on J, for example, let $E_1 := \{\alpha^j \mid j \in J \text{ and } x_j \neq \tilde{y}_j\}$, and write $e_1 := |E_1|$ for the number of errors on the non-erased part. Letting also $E_0 := \{\alpha^j \mid j \notin J\}$ be the set of erased coordinates, it holds that $E := E_1 \cup E_0$ is a full set of error locators for $\tilde{e}$. Define $\sigma_0(X) := \Pi_{\beta \in E_0}(1-\beta X)$ and $\sigma_1(X) := \Pi_{\beta \in E_1}(1-\beta X)$, so that $\sigma_E = \sigma_0 \sigma_1$. The key equation now reads $S \sigma_0 \sigma_1 \equiv \omega_E \mod (X^{d-1})$, where $S := S^{(y)}$. Defining $\tilde{S} := S \sigma_0 \mod X^{d-1}$, we also have $\tilde{S} \sigma_1 \equiv \omega_E \mod (X^{d-1})$.

For $g(X) \in F_q[X]$ and $r \in N$, let $M_{g,r} \subseteq F_q[X] \times F_q[X]$ for the solution module of a "generic" key equation: $M_{g,r} = \{(u, v) \in F_q[X] \times F_q[X] \mid u \equiv gv \mod(X^r)\}$ For a pair $(u, v) \in F_q[X]^2$, define the order ord(u, v) by ord(u, v) := max{deg(u)+1, deg(v)}. Also, for integer w, possibly zero or negative, define the (1, w)-weighted degree as $\text{wdeg}_{1,w}(u, v) := \max\{\deg(u), \deg(v)+w\}$. Note that when $w=-1$, the order is the same as the weighted degree, up to an additive constant: $\text{ord}(u, v) = \text{wdeg}_{1,-1}(u, v)+1$. The basis for practically all errors and erasures decoding algorithms is the following well-known proposition, for which the proof is omitted.

Proposition 1:
1. $\gcd(w_E, \sigma_1)=1$.
2. Suppose that $2e_1+e_0 \leq d-1$ and that $S \neq 0$. Then
    a. $(\omega_E, \sigma_1)$ has the minimum $(1, e_0-1)$-weighted degree in $M_{\bar{S},d-1}\setminus\{(0,0)\}$. Also, if some non-zero $(u, v) \in M_{\bar{S},d-1}$ has $\text{wdeg}_{1,e_0-1}(u, v) = \text{wdeg}_{1,e_0-1}(\omega_E, \sigma_1)$, then there exists some constant $c \in F_q^*$ such that $(u, v) = c \cdot (\omega_E, \sigma_1)$.
    b. Define $N := \{(u, v) \in M_{S,d-1} | \sigma_0 \text{ divides } v\}$. Then $(\omega_E, \sigma_E)$ has the minimum $(1,-1)$-weighted degree in $N\setminus\{(0,0)\}$. Also, if some non-zero $(u, v) \in N$ has $\text{wdeg}_{1,-1}(u, v) = \text{wdeg}_{1,-1}(\omega_E, \sigma_E)$, then there exists some $c \in F_q^*$ such that $(u, v) = c \cdot (\omega_E, \sigma_F)$.

Proposition 1 shows that decoding can be performed by solving a minimization problem. For example, the Euclidean algorithm can be used to solve the minimization in part 2(a) of the proposition, and a modified Berlekamp-Massey (BM) algorithm can be used to solve the minimization of part 2(b).

Koetter's Iteration

This section uses the general form of Koetter's iteration, and K is an arbitrary field. In particular, for a field K and a monomial ordering $<$ on $K[X]^\ell$, for some $\ell \in \mathbb{N}^*$, write $\text{LM}<(\cdot)$ for the leading monomial of a vector of polynomials with respect to $<$. When the ordering is clear from the context, simply write $\text{LM}(\cdot)$ for $\text{LM}_<(\cdot)$.

For a $K[X]$-submodule $M \subseteq K[X]^{\ell+1}$, for positive integer $\ell$, of rank $\ell+1$, let $G = \{g_0, \ldots, g_\ell\}$ be a Groebner basis for M with respect to some monomial ordering $<$ on $K[X]^{\ell+1}$. Assume without loss of generality that the leading monomial of $g_j$ contains the j-th unit vector, counting from 0.

Let D: $K[X]^{\ell+1} \to K$ be a non-zero linear functions for which $M^+ := M \cap \ker(D)$ is a $K[X]$-module. Koetter's iteration converts the $(\ell+1)$-element Groebner basis G of M to an $(\ell+1)$-element Groebner basis $G^+ = \{g_0^+, \ldots, g_\ell^+\}$ of $M^+$, while maintaining the property that $\text{LM}(g_j^+)$ contains the j-th unit vector. It is presented in the following pseudo code.

---

Koetter's iteration:
Input: A Groebner basis G = $\{g_0, \ldots, g_\ell\}$ for M with $\text{LM}(g_j)$ containing the j-th unit vector for all j
Output: A Groebner basis $G^+ = \{g_0^+, \ldots, g_\ell^+\}$ for $M^+$ with $\text{LM}(g_j^+)$ containing the j-th unit vector for all j
Algorithm:
  For $j = 0, \ldots, \ell$, calculate $\Delta_j := D(g_j)$
  Set $J = \{j \in \{0, \ldots, \ell\} | \Delta_j \neq 0\}$
  For $j \in \{0, \ldots, \ell\} \setminus J$
    Set $g_j^+ := g_j$ Let $j^* \in J$ be such that $LM(g_{j^*}) = \min_{j \in J}\{LM(g_j)\}$ For $j \in J$ If $j \neq j^*$, set $g_j^+ := g_j - \frac{\Delta_j}{\Delta_{j^*}} \cdot g_{j^*}$ Else, set $g_{j^*}^+ := \left(X - \frac{D(Xg_{j^*})}{\Delta_{j^*}}\right)g_{j^*}$

---

The Decoding Tree

A possible embodiment of the decoding tree is described as follows. In an embodiment, there are $\eta_{chase}$ coordinates for Chase flippings and $\eta_{GMD}$ coordinates for variable GMD erasure attempts (on top of the $e_0^{(1)}$ fixed erasures). Let $I_{chase} = \{\gamma_1, \ldots, \gamma_{\eta_{chase}}\} \subseteq F_q'$ be the set of coordinates on which Chase test vectors are scanned, and $I_{GMD} := \{\gamma_{\eta_{chase}+1}, \ldots, \gamma_{\eta_{chase}+\eta_{GMD}}\}$ be the set of coordinates on which GMD erasures are attempted. The sets $I_{chase}$ and $I_{GMD}$ are determined from the channel reliability information, such as the $\rho_i^{(1)}$ and $\rho_i^{(2)}$ defined above.

Writing $\eta := \eta_{chase} + \eta_{GMD}$, each Chase test vector/GMD erasure pattern of an embodiment is determined by a binary vector of length $\eta$. The first $\eta_{chase}$ coordinates determine the Chase test error vector on $I_{chase}$, where a 0 entry in coordinate $i \in \{1, \ldots, \eta_{chase}\}$ corresponds to a 0 on $\gamma_i$, while a 1 entry in coordinate i corresponds to the second most likely error value in coordinate $\gamma_i$. Note that the most likely error value is 0, by definition of the HD received vector.

Similarly, the following $\eta_{GMD}$ coordinates determine a GMD erasure pattern, where a zero in coordinate $i \in \{\eta_{chase}+1, \ldots, \eta_{chase}+\eta_{GMD}\}$ corresponds to not erasing coordinate $\gamma_i$, while a one in coordinate i corresponds to erasing coordinate $\gamma_i$.

The binary vectors of length n and Hamming weight up to $r_{max}$, for some pre-defined $r_{max}$, are arranged on the vertices of a directed tree T which shall now be defined. The root is the all zero vector in $F_2^\eta$, and, for all $r \in \{1, \ldots, r_{max}\}$, the vertices at depth r are the vectors of weight r in $F_2^\eta$. To define the edges of T, for each $r \geq 1$ and for each vertex $\beta = (\beta_1, \ldots, \beta_\eta) \in F_2^\eta$ at depth r with non-zero entries at coordinates $i_1, \ldots, i_r$, pick a single vertex $\beta' = (\beta'_1, \ldots, \beta'_\eta)$ at depth r-1 that is equal to $\beta$ on all coordinates, except for one if $i_\ell (\ell \in \{1, \ldots, r\})$, for which $\beta'_{i_\ell} = 0$. Note that there are r distinct ways to choose $\beta'$ given $\beta$, and one such choice can be fixed. Now the edges of T are exactly all pairs $(\beta', \beta)$.

The edge $(\beta', \beta)$ defined above corresponds to adjoining exactly one additional flipped or erased coordinate (i.e., $\gamma_{i_\ell}$). Hence, the edge $(\beta', \beta)$ can be alternatively marked by $(\beta', \gamma_{i_\ell})$. Similarly, a path can be identified from the root to a vertex at depth $r \geq 1$, and hence the vertex itself, with a vector $(\gamma_{i_1}, \ldots, \gamma_{i_r})$ with distinct $\gamma_{i_\ell}$'s.

Note that scanning the tree T corresponds to scanning all combinations of test error vectors and erasure patterns on $I := I_{chase} \cup I_{GMD}$ for which the total number of non-zero test error values plus the total number of variable erasures is at most $r_{max}$.

It should be kept in mind that the above is only one possible choice of the decoding tree. For example, in the above tree, when $r = \eta$, all possible erasure patterns on $I_{GMD}$ are eventually scanned. In an alternative embodiment, many fewer erasure patterns are scanned. In this alternative embodiment, coordinates on $I_{GMD}$ are ordered in an ascending value of channel reliability, and for each test error pattern on $I_{chase}$, the decoder first deletes the two least reliable coordinates on $I_{GMD}$, then the next two coordinates, etc.

The Minimization Tasks

Let $r, e_0 \in \{0, \ldots, n\}$, where n is the code length, let $\alpha_1, \ldots, \alpha_r, \alpha'_1, \ldots, \alpha'_{e_0} \in F_q^*$ be distinct, and let $\beta_1, \ldots, \beta_r \in F_q^*$ (not necessarily distinct). The pairs $(\alpha_j, \beta_j)$ are the locators and value pairs of a hypothesized error pattern during the fast Chase/GMD decoding, while the $\alpha'_j$ represent a hypothesized set of erased locators. Let $A' := \{\alpha'_j\}$ be the set of erased locators, and let $\sigma_0(X) := \prod_{j=1}^{e_0}(1-\alpha'_j X)$ be the erasure ELP.

Remark 1: Note that for convenience, this section uses a slightly different notation than that of the previous section. For example, the erasure locators are marked by A' instead of $E_0$, etc.

In practice, the erasure set A' can be further divided into a "large" fixed subset of erasures that is present throughout the fast Chase/GMD decoding algorithm, and a "small" variable set of erasures, that is the current erasure hypothesis. Hence, let $e_0^{(1)} \leq e_0$ be the number of fixed erasures, $e_0^{(2)} := e_0 - e_0^{(1)}$ be the number of variable erasures, $$A_1' := \left\{ \alpha_1', \ldots, \alpha_{e_0^{(1)}}' \right\}$$

be the set of fixed erasures, $$A_2' := \left\{ \alpha_{e_0^{(1)}+1}', \ldots, \alpha_{e_0}' \right\}$$

be the current hypothesis of variable erasures. In addition, set $\sigma_0^{(1)} := \Pi_{\alpha \in A_1'}(1-\alpha X)$ and $\sigma_0^{(2)} := \Pi_{\alpha \in A_2'}(1-\alpha X)$, so that $\sigma_0 = \sigma_0^{(1)} \cdot \sigma_0^{(2)}$ Next are defined some useful $F_q[X]$-modules. Let $\tilde{y}$ be obtained from the received vector y, which includes erasures on the set $A_1'$ of fixed erasures, by filling in arbitrary values on the erased coordinates. Let $$M'_{r,e_0^{(1)},e_0^{(2)}} = M'_{r,e_0^{(1)},e_0^{(2)}}\left(S^{(\tilde{y})}, \{\alpha_j\}_{j=1}^r, \{\beta_j\}_{j=1}^r, \{\alpha_j'\}_{j=1}^{e_0}\right)$$
$$:= \left\{ (u,v) \in F_q[X]^2 \;\middle|\; \begin{array}{c} u \equiv (S^{(\tilde{y})}\sigma_0^{(1)})v \bmod(X^{d-1}) \\ \forall j \in \{1, \ldots, r\}, \left\{ \begin{array}{c} v(\alpha_j^{-1}) = 0 \\ \beta_j a_j \sigma_0^{(1)}(\alpha_j^{-1})v'(\alpha_j^{-1}) = -\alpha_j u(\alpha_j^{-1}) \end{array} \right. \\ \forall j \in \{e_0^{(1)}+1, \ldots, e_0\}, v(\alpha_j'^{-1}) = 0 \end{array} \right\},$$

with $a_j := \tilde{a}_{i'}$ for the unique $i' \in \{0, \ldots, n-1\}$ with $\alpha_j = \lambda^{i'}$. Let also $$M''_{r,e_0} = M''_{r,e_0}\left(S^{(\tilde{y})}, \{\alpha_j\}_{j=1}^r, \{\beta_j\}_{j=1}^r, \{\alpha_j'\}_{j=1}^{e_0}\right)$$
$$:= \left\{ (u,v) \in F_q[X]^2 \;\middle|\; \begin{array}{c} u \equiv (S^{(\tilde{y})}\sigma_0)v \bmod(X^{d-1}) \\ \forall j \in \{1, \ldots, r\}, \left\{ \begin{array}{c} v(\alpha_j^{-1}) = 0 \\ \beta_j a_j \sigma_0(\alpha_j^{-1})v'(\alpha_j^{-1}) = -\alpha_j u(\alpha_j^{-1}) \end{array} \right. \end{array} \right\}.$$

Also refer to the following module for fast Chase decoding without any erasures.

$$M_r = M_r\left(S^{(\tilde{y})}, \{\alpha_j\}_{j=1}^r, \{\beta_j\}_{j=1}^r\right)$$
$$:= \left\{ (u,v) \in F_q[X]^2 \;\middle|\; \begin{array}{c} u \equiv S^{(\tilde{y})}v \bmod(X^{d-1}) \\ \forall j \in \{1, \ldots, r\}, \left\{ \begin{array}{c} v(\alpha_j^{-1}) = 0 \\ \beta_j a_j v'(\alpha_j^{-1}) = -\alpha_j u(\alpha_j^{-1}) \end{array} \right. \end{array} \right\}.$$

Remark 2. Note that:
1. Both $$M'_{r,e_0^{(1)},e_0^{(2)}}$$

and $M_{r,e_0}''$ are defined as the set of all pairs of polynomial that satisfy a certain key-equation-type congruence, plus certain conditions that depend on the so-far hypothesized errors and erasures. As will be explained below, each additional condition can be taken into account by using update rules based on Koetter's iteration.
2. Note that $$M'_{r,e_0^{(1)},e_0^{(2)}}$$

and $M_{r,e_0}''$ take erasures info account in two different ways. Clearly, $$M'_{r,e_0^{(1)},e_0^{(2)}}$$

is more suitable for vehicle erasure patterns, as it does not include a modified syndrome depending on the variable part of the erasure pattern, and the Forney-like condition appearing in its definition does not require evaluating a varying erasure ELP. In fact, and $M_{r,e_0}''$ is presented mainly as an auxiliary tool for the statement and proof of Theorem 3, below, while $$M'_{r,e_0^{(1)},e_0^{(2)}}$$

is the module actually used to define the update rules of the fast combined Chase/GMD decoding.
3. Observing the conditions that appear in the definition of $$M'_{r,e_0^{(1)},e_0^{(2)}},$$

it is apparent that it has a very similar form to that of $M_r$, except for the following differences:
  a. It includes additional constraints of the form $v(\alpha_j^{-1})=0$. Each such constraint has the same form as the first part of the constraint for Chase flipping.
  b. Each $a_j$, $j \in \{1, \ldots, r\}$, is replaced by $a_j' := \sigma_0^{(1)}(\alpha_j^{-1})a_j$, and $S^{(\tilde{y})}$ is replaced by $\tilde{S} := S^{(\tilde{y})}\sigma_0^{(1)}$ mod $(X^{d-1})$. Once it is decided that HD decoding failed and that fast combined Chase/GMD should be initiated, $\sigma_0^{(1)}$ can be calculated, and consequently also $\tilde{S}$ and $a_j'$ for all the $\eta_{chase}$ coordinates on which Chase flippings are planned.

Let $A \subseteq F_q^* \backslash A'$ be the set of all error locators outside A', and let $E := A \cup A'$, so that E is a full set of error locators. Let $\sigma_E(X) := \Pi_{\alpha \in E}(1-\alpha X)$, $\sigma_1(X) := \Pi_{\alpha \in A}(1-\alpha X)$. In this section, it will sometimes be more convenient to index vectors by elements of $F_q^*$ (instead of by integers in $\{0, 1, \ldots, n-1\}$). Thus, for $\alpha \in E$, let $\beta(\alpha)$ be the corresponding error value (possibly zero), and let $a(\alpha)$ be the corresponding value of the GRS scaling vector $\tilde{a}$ (that is, if $\alpha = \lambda^i$, then $a(\alpha) := \tilde{\alpha}_i)$. In this notation, we have $\omega_E = \Sigma_{\alpha \in E} \beta(\alpha) a(\alpha) \Pi_{\alpha' \in E \setminus \{\alpha\}} (1 - \alpha' X)$, and Forney's formula reads $$\forall \alpha \in E, \beta(\alpha) a(\alpha) \sigma'_E(\alpha^{-1}) = -\alpha \omega_E(\alpha^{-1})$$

In what follows, we will switch between indexing by integers and indexing by field elements (choosing the notation simplest in each context), and it should be clear from the context which notation is used.

The possibility of using Koetter's iteration for combined fast Chase/GMD decoding follows almost immediately from the following theorem. In the theorem, for a subset $U \subseteq F_q^*$ and a vector $z$: $F_q^* \to F_q$, we write $z|_U$ for the punctured vector obtained by restricting $z$ to $U$. Also, we write $U^c = F_q^* \setminus U$ for the complementary set of $U$ in $F_q^*$.

Theorem 3.

1. For all $r$, $M_r$, $$M'_{r, e_0^{(1)}, e_0^{(2)}},$$

$M_{r, e_0}''$ are $F_q[X]$-modules.

2. The map $\theta$:

$$M'_{r, e_0^{(1)}, e_0^{(2)}} \to F_q[X]^2,$$

$(u, v) \mapsto (u, v/\sigma_0^{(2)})$ is a monomorphism of $F_q[X]$-modules whose image is exactly $M_{r, e_0}''$ and therefore induces an isomuiplusin $$M'_{r, e_0^{(1)}, e_0^{(2)}} \to M''_{r, e_0}$$

which shall be called $\theta$.

3. If $2d_H(y|_{(A\gamma)^c}, x|_{(A\gamma)^c}) + e_0 \leq d - 1 + 2r$, $\alpha_1, \ldots, \alpha_r$ are error locators and $\beta_1, \ldots, \beta_r$ are the corresponding error values, then:

c. $(\omega_E, \sigma_1) \in M_{r, e_0}''$, and for the $(1, e_0-1)$-weighted lexicographic ordering with $Y > X$, it holds that $LM(\omega_E, \sigma_1) = \min \{LM(u, v) | (u, v) \in M_{r, e_0}'' \setminus \{0\}\}$.

d.

$$(\omega_E, \sigma_1 \sigma_0^{(2)}) \in M'_{r, e_0^{(1)}, e_0^{(2)}}$$

and for the $(1, e_0^{(1)}-1)$-weighted lexicographic ordering with $Y > X$, $$LM(\omega_E, \sigma_1 \sigma_0^{(2)}) = \min \left\{ LM(u, v) \middle| (u, v) \in M'_{r, e_0^{(1)}, e_0^{(2)}} \setminus \{0\} \right\}$$

The proof is omitted here.

Working with LowDegree Polynomials

Instead of working directly with the polynomials in $$M'_{r, e_0^{(1)}, e_0^{(2)}},$$

it is positive to work with polynomials of a much lower degree. From this point on, write $<_w$ for the $(1, w)$-weighted lexicographic ordering with $Y > X$. Let $\{h_0 = (h_{00}, h_{01}), h_1 = (h_{10}, h_{11})\}$ be a Groebner basis for $$M'_{0, e_0^{(1)}, 0}$$

with respect to the monomial ordering $$<_{e_0^{(1)} - 1},$$

such that the leading monomial of $h_0$ is on the left, i.e., in the first coordinate, while the leading monomial of $h_1$ is on the right, i.e., in the second coordinate. Since $\{h_0, h_1\}$ is also a free-module basis, every element $$(u, v) \in M'_{0, e_0^{(1)}, 0}$$

can be written as $(u, v) = f_0(X) h_0 + f_1(X) h_1$ for a unique pair $(f_0(X), f_1(X))$, and the map $\mu$:

$$M'_{0, e_0^{(1)}, 0} \to F_q[X]^2,$$

$(u, v) \mapsto (f_0, f_1)$ is an isomorphism of $F_q[X]$-modules. $\mu$:

Note that for all $r$, $e_0^{(2)}$, $$M'_{r, e_0^{(1)}, e_0^{(2)}} \subseteq M'_{0, e_0^{(1)}, 0}$$

is a submodule, and let $$N_{r, e_0^{(1)}, e_0^{(2)}} = N_{r, e_0^{(1)}, e_0^{(2)}} \left( S^{(y)}, \{\alpha_j\}_{j=1}^r, \{\beta_j\}_{j=1}^r, \{\alpha'_j\}_{j=1}^{e_0} \right) :=$$

$$\mu \left( M'_{r, e_0^{(1)}, e_0^{(2)}} \left( S^{(y)}, \{\alpha_j\}_{j=1}^r, \{\beta_j\}_{j=1}^r, \{\alpha'_j\}_{j=1}^{e_0} \right) \right)$$

be the $\mu$-image of $$M_{r, e_0^{(1)}, e_0^{(2)}}.$$

Refer to $$N_{r, e_0^{(1)}, e_0^{(2)}}$$

as the module of coefficient polynomials of $$M_{r, e_0^{(1)}, e_0^{(2)}}.$$

By writing a typical element $$(u, v) \in M_{r, e_0^{(1)}, e_0^{(2)}}$$

as $f_0(X)h_0 + f_1(X)h_1$ and substituting in the constraints in the definition of $$M_{r, e_0^{(1)}, e_0^{(2)}},$$

the following characterization of $N_r$ can be obtained with constraints that are suitable for applying Koetter's iteration. For the following proposition, recall from part 3(b) of Remark 2 that for all $j \in \{1, \ldots, r\}$, $a_j' = \sigma_0^{(1)}(\alpha_j^{-1})a_j$.

Proposition 4. It holds that $$N_{r, e_0^{(1)}, e_0^{(2)}}$$

is the set of an pairs $(f_0, f_1) \in F_q[X]^2$ that satisfy the following conditions:

- $\forall i \in \{1, \ldots, r\}$,

1. $b_{0i} f_0(\alpha_i^{-1}) + b_{1i} f_1(\alpha_i^{-1}) = 0$, and

2. $b_{0i} f_0'(\alpha_i^{-1}) + c_{0i} f_0(\alpha_i^{-1}) + b_{1i} f_1'(\alpha_i^{-1}) + c_{1i} f_1(\alpha_i^{-1}) = 0$, where $b_{0i} = h_{01}(\alpha_i^{-1})$, $b_{1i} = h_{11}(\alpha_i^{-1})$, $c_{0i} = h_{01}'(\alpha_i^{-1}) + \frac{\alpha_i}{\beta_i \alpha_i'} h_{00}(\alpha_i^{-1})$, $c_{1i} = h_{11}'(\alpha_i^{-1}) + \frac{\alpha_i}{\beta_i \alpha_i'} h_{10}(\alpha_i^{-1})$

- $\forall i \in \{e_0^{(1)} + 1, \ldots, e_0\}$, $b_{0i} f_0(\alpha_i'^{-1}) + b_{1i} f_1(\alpha_i'^{-1}) = 0$ To translate the minimality assertion of Theorem 3 to the language of coefficient polynomials, the following proposition can be used for the case where erasures are present.

Proposition 5. Let $w = \deg(h_{11}) - \deg(h_{00}) + e_0^{(1)} - 1$. Then for all $$(u_1, v_1), (u_2, v_2) \in M'_{0, e_0^{(1)}, 0},$$

it holds that $$LM_{<_{e_0^{(1)}-1}}(u_1, v_1) <_{e_0^{(1)}-1} LM_{<_{e_0^{(1)}-1}}(u_2, v_2) \Leftrightarrow$$

$$LM_{<_w}(\mu(u_1, v_1)) <_w LM_{<_w}(\mu(u_2, v_2))$$

The proof is omitted.

Theorem 3 and Proposition 5 indicate that one should search for a vector of minimal leading monomial in $$N_{r, e_0^{(1)}, e_0^{(2)}},$$

with respect to $<_w$, and for this it is sufficient to have a Groebner basis for $$N_{r, e_0^{(1)}, e_0^{(2)}},$$

with respect to $<_w$. One may then take the unique vector of minimal leading monomial in this two-element Groebner basis. Alternatively, but typically less efficiently, search for a Groebner basis of $$M'_{r, e_0^{(1)}, e_0^{(2)}},$$

with respect to $$<_{e_0^{(1)}-1}.$$

The definition of $$N_{r, e_0^{(1)}, e_0^{(2)}}$$

shows how a Groebner basis for $$N_{r, e_0^{(1)}, e_0^{(2)}}$$

can be converted to a Groebner basis for $$N_{r+1, e_0^{(1)}, e_0^{(2)}}$$

by two applications of Koetter's iteration, or to a Groebner basis for $$N_{r, e_0^{(1)}, e_0^{(2)}+1}$$

with a single iterations of Koetter's iteration.

The exact update rules that corresponding to one or two Koetter iterations are detailed below. Note that such update rules are key to a fast Chase/GMD according to an embodiment: for an additional flip or erasure, do not start from scratch, but rather use all accumulated computations so far as a starting point, and apply only a low-complexity update rule.

Finally, note that by definition, $$N_{0, e_0^{(1)}, 0} = F_q^2,$$

so that one can take $\{(1,0), (0,1)\}$ as the $<_w$-Groebner basis for this module. This Groebner basis will be used on the root of the decoding tree.

Algorithms

Initialization

The initialization of a fast combined Chase/GMD algorithm according to an embodiment is performed after bounded-distance HD decoding fails. To initialize an algorithm, one must find a Groebner basis for $$M'_{0,e_0^{(1)},0},$$

Where the only constraint is $u=(S^{(y)} \sigma_0^{(1)})v \bmod(x^{d-1})$, with respect to $$<_{e_0^{(1)}-1}.$$

One algorithm for finding a Groebner basis for $$M'_{0,e_0^{(1)},0}$$

is as follows:

---

Input:
$g(X) := S^{(y)}\sigma_0^{(1)} \bmod X^{d-1}$
$r := e_0^{(1)} - 1$
$v := d - 1$
Output:
$\{(a_0(X), b_0(X)), (a_1(X), a_2(X))\}$ – a Groebner basis for $M'_{0,e_0^{(1)},0}$ Initialize:
$(a_0, b_0) := (1, 0); (a_1, b_1) := (0, 1); \alpha_0 := -1; j := 1; k := 0$
Iterations:
 If $r \geq 0$,
  $i := 0; d := 1 + r$
 Else
  $i := 1; d := -r$
 While $k < \eta$ Do
  $\alpha_j :=$ Coefficient of $X^k$ in $b_j(X) \cdot g(X)$
  $k := k + 1$
  If $\alpha_i \neq 0$, $(a_{1-i}(X), b_{1-i}(X)) := (a_{1-i}(X), b_{1-i}(X)) - \frac{\alpha_{1-i}}{\alpha_i}(a_i(X), b_i(X))$ $(a_i(X), b_i(X)) := (Xa_i(X), Xb_i(X))$
  $j := 1 - i$
  $d := d - 1$
  If $d = 0$,
   $i := 1 - i; d := 1$
  Else
   $(a_{1-i}(X), b_{1-i}(X)) := (Xa_{1-i}(X), Xb_{1-i}(X))$
   $j := i; d := d + 1$

---

At the end of the algorithm, the leading monomials of $(a_0(X), b_0(X)), (a_1(X), b_1(X))$ with respect to $$<_{e_0^{(1)}-1}$$

are not in the same coordinate. For proceeding with combined Chase/GMD decoding, the first Groebner basis element is taken to be the $(a_i(X), b_i(X))$ $(i=0,1)$ whose leading monomial is on the left, and the second Groebner basis element to be $(a_{1-i}(X), b_{1-i}(X))$.

Alternatively, the two polynomials updates during the errors-and-erasures BM algorithm can be used to obtain the Groebner basis, as follows. One efficient version of the BM algorithm for errors and erasures is the following. The output is two pairs of polynomials.

---

Algorithm A: efficient errors and erasures BM algorithm
Input:
 $S^{(y)}(X)$
 $e_0^{(1)}$
 $\sigma_0^{(1)} := \Pi_{\alpha \in A'_1}(1 - \alpha X)$
Output:
 $v(X)$, if $2e_1 + e_0^{(1)} \leq d - 1$, otherwise $v(X) = \sigma_1(X) := \Pi_{\alpha \in A}(1 - \alpha X)$, where $v(X)$ is an estimated ELP that excludes erasures;

$v^-(X)$, which is required for finding a Groebner basis for $M'_{0,e_0^{(1)},0}$;

$\delta$, which is associated with finding a Groebner basis for $M'_{0,e_0^{(1)},0}$;

Initialization:
 Calculate $\tilde{S}(X) := S^{(y)}(X)\sigma_0^{(1)}(X) \bmod X^{(d-1)}$
 $v(X) := 1$
 $v^-(X) := 1$
 $\delta := 1$
 $b := 1$
 $L := e_0^{(1)}$
Iterations:
 For $j = e_0^{(1)}$ to $d - 2$
  Set $\Delta :=$ Coeff$_{X^j}(\tilde{S}v)$
  If $\Delta = 0$
   Update $\delta \leftarrow \delta + 1$
  If $\Delta \neq 0$ and $(j - e_0^{(1)}) \leq 2(L - e_0^{(1)}) - 1$
   Update $v(X) \leftarrow v(X) - \Delta \cdot b^{-1}X^\delta v^-(X)$
   Update $\delta \leftarrow \delta + 1$
  If $\Delta \neq 0$ and $(j - e_0^{(1)}) \geq 2(L - e_0^{(1)})$
   Set TMP $:= v(X)$
   Update $v(X) \leftarrow v(X) - \Delta \cdot b^{-1}X^\delta v^-(X)$
   Update $L \leftarrow j + 1 - L + e_0^{(1)} // \Leftrightarrow (L - e_0^{(1)}) \leftarrow (j - e_0^{(1)}) + 1 - (L - e_0^{(1)})$
   Set $v^-(X) :=$ TMP
   Set $b := \Delta$
   Set $\delta := 1$

---

To obtain a Groebner basis from the outputs of the algorithm, in case plain errors and erasures decoding fails, it is possible to proceed in the following way:

1. Calculate
 $b_0 = (\tilde{S}v^- \bmod X^{d-1}, v)$
 $b_1 = (\tilde{S}X^\delta v^- \bmod X^{d-1}, X^\delta v^-)$ 2. If $$LM_{<_{e_0^{(1)}-1}}(b_0) \text{ and } LM_{<_{e_0^{(1)}-1}}(b_1)$$

contain different unit vectors (i.e., are located at different coordinates), then Let $h_0$ be the vector from $\{b_0, b_1\}$ with leading monomial in the first coordinate, and let $h_1$ be the vector from $\{b_0, b_1\}$ with leading monomial in the second coordinate Output $\{h_0, h_1\}$ as the Groebner basis 3. If $$LM_{<_{e_0^{(1)}-1}}(b_0) \text{ and } LM_{<_{e_0^{(1)}-1}}(b_1)$$

contain the same unit vector (i.e., they are on the same side), then:
If $$LM_{<_{e_0^{(1)}-1}}(b_0) <_{e_0^{(1)}-1} LM_{<_{e_0^{(1)}-1}}(b_1),$$

then for the unique $c \in F_q^*$ and $\ell \in N^*$ that assure leading monomial cancellation, update $b_1 \leftarrow b_1 - c X^\ell b_0$
If $$LM_{<_{e_0^{(1)}-1}}(b_0) \geq_{e_0^{(1)}-1} LM_{<_{e_0^{(1)}-1}}(b_1),$$

then for the unique $c \in F_q^*$ and $\ell \in N$ that assure leading monomial cancellation, update $b_0 \leftarrow b_0 - c X^\ell b_1$
Calculate and output $\{h_0, h_1\}$ as in step 2.

Note that by the definition of the monomial ordering $<_w$ (for any w), the comparison $$\text{``}LM_{<_{e_0^{(1)}-1}}(b_0) <_{e_0^{(1)}-1} LM_{<_{e_0^{(1)}-1}}(b_1)\text{''}$$

in step 3 is equivilant to $\deg(b_{0j}(X)) < \deg(b_{1j}(X))$, where j is the common coordinate of the leading monomial. Similarly, $$\text{``}LM_{<_{e_0^{(1)}-1}}(b_0) \geq_{e_0^{(1)}-1} LM_{<_{e_0^{(1)}-1}}(b_1)\text{''}$$

is equivalent to $\deg(b_{0j}(X)) \geq \deg(b_{1j}(X))$.

Note that any algorithm for finding a Groebner basis for the module defined by the above constraint can also be used for HD errors-and-erasures decoding for the fixed $e_0^{(1)}$ erasures. In a typical application, the Groebner basis for initialization is obtained from the same algorithm used for the initial errors-and-erasures HD decoding, in order to reduce complexity.

Update Rule for an Additional Flip

This rule corresponds to the case of moving from $$N_{r-1, e_0^{(1)}, e_0^{(2)}} \text{ to } N_{r, e_0^{(1)}, e_0^{(2)}}.$$

---

Algorithm B: edge update rule for moving from $N_{r-1, e_0^{(1)}, e_0^{(2)}}$ to $N_{r, e_0^{(1)}, e_0^{(2)}}$.

In the following, there are two types of iterations. In the "root"-type iteration, the algorithm imposes that some of the updated polynomials have an additional root. In the "derivative" iterations, the algorithm imposes that the updated polynomials satisfy Forney's formula, which involves the derivative of some polynomials.

Input:
  w := $\deg(h_{11}) - \deg(h_{00}) + e_0^{(1)} - 1$ (this depends only on the initialization on the root of the decoding tree)

A Groebner basis $G = \{f_0 = (f_{00}, f_{01}), f_1 = (f_{10}, f_{11})\}$ for $N_{r-1, e_0^{(1)}, e_0^{(2)}}$, with $LM_w(f_j)$ containing the j-th unit vector for $j \in \{0, 1\}$
  The next hypothesized error location $\alpha_r$ and the corresponding hypothesized error value, $\beta_r$ Output:

A Groebner basis $G^+ = \{f_0^+ = (f_{00}^+, f_{01}^+), f_1^+ = (f_{10}^+, f_{11}^+)\}$ for $N_{r, e_0^{(1)}, e_0^{(2)}}$, with $LM_w(f_j)$ containing the j-th unit vector for $j \in \{0, 1\}$ Algorithm:
  For type = root, der
    If type = der
      For j = 0, 1, set $f_j := f_j^+$ // init: output of root iter.
    For j = 0, 1, calculate $$\Delta_j := \begin{cases} b_{0r} f_{j0}(\alpha_r^{-1}) + b_{1r} f_{j1}(\alpha_r^{-1}), & \text{if type = root} \\ b_{0r} f_{j0}'(\alpha_r^{-1}) + c_{0r} f_{j0}(\alpha_r^{-1}) + b_{1r} f_{j1}'(\alpha_r^{-1}) + c_{1r} f_{j1}(\alpha_r^{-1}), & \text{if type = der} \end{cases}$$

(where $b_{0r}, b_{1r}, c_{0r}, c_{1r}$ are defined in Proposition 4)
    Set $J := \{j \in \{0, 1\} | \Delta_j \neq 0\}$
    For $j \in \{0, 1\} \setminus J$, set $f_j^+ := f_j$ Let $j^* \in J$ be such that $LM_w(f_{j^*}) = \min_{j \in J}\{LM_w(f_w)\}$ -continued For $j \in J$ If $j \neq j^*$, set $f_j^+ := f_j - \dfrac{\Delta_j}{\Delta_{j^*}} f_{j^*}$ Else, set $f_{j^*}^+ := (X - \alpha_r^{-1}) f_{j^*}$ Update Rule for an Additional Variable Erasure This rule corresponds to the case of moving from $$N_{r,e_0^{(1)},e_0^{(2)}-1} \text{ to } N_{r,e_0^{(1)},e_0^{(2)}},$$

which is one additional variable erasure. It is very similar to Algorithm B, and simpler than Algorithm B in the sense that instead of two iterations in Algorithm B ("root", "der"), only a single iteration is configured.

Case 2 is referred to as a false positive. The only cost of a false positive is in unnecessarily performing an exhaustive substitution in polynomials, i.e., in an increase in complexity. Since false positives are rare (see below for more on this), the resulting increment in complexity is typically negligible.

For the stopping condition to work, one additional error is needed in the unreliable coordinates on top of the minimum configured by part 3 of Theorem 3. This slightly reduces the correction capability of the combined fast Chase/GMD algorithm.

Algorithm C: edge update rule for moving from $N_{r,e_0^{(1)},e_0^{(2)}-1}$ to $N_{r,e_0^{(1)},e_0^{(2)}}$.

Input:
  w := $\deg(h_{11}) - \deg(h_{00}) + e_0^{(1)} - 1$ (this depends only on the initialization on the root of the decoding tree)

A Groebner basis $G = \{f_0 = (f_{00}, f_{01}), f_1 = (f_{10}, f_{11})\}$ for $N_{r,e_0^{(1)},e_0^{(2)}-1}$, with $LM_w(f_j)$ containing the j-th unit vector for $j \in \{0, 1\}$
  The next hypothesized erasure location $\alpha'$ and the corresponding hypothesized error value, $\beta_r$
Output:

A Groebner basis $G^+ = \{f_0^+ = (f_{00}^+, f_{01}^+), f_1^+ = (f_{10}^+, f_{11}^+)\}$ for $N_{r,e_0^{(1)},e_0^{(2)}}$, with $LM_w(f_j)$ containing the j-th unit vector for $j \in \{0, 1\}$
Algorithm:
  For $j = 0, 1$, calculate $\Delta_j := h_{01}(\alpha'^{-1}) f_{j0}(\alpha'^{-1}) + h_{11}(\alpha'^{-1}) + f_{j1}(\alpha'^{-1})$
  Set $J := \{j \in \{0, 1\} | \Delta_j \neq 0\}$
  For $j \in \{0, 1\} \setminus J$, set $f_j^+ := f_j$ Let $j^* \in J$ be such that $LM_w(f_{j^*}) = \min_{j \in J}\{LM_w(f_w)\}$ For $j \in J$ If $j \in j^*$, set $f_j^+ := f_j - \dfrac{\Delta_j}{\Delta_{j^*}} f_{j^*}$ Else, set $f_{j^*}^+ := (X - \alpha_r^{-1}) f_{j^*}$ The Stopping Condition Write $\hat{\sigma} = f_{10}(X) h_{01}(X) + f_{11}(X) h_{11}(X)$ for the so-far estimated ELP. Note that this polynomial may not be calculated explicitly. To definitely decide, at least up to undetected errors inherently possible for the GRS code, whether the so-far flippings and erasures result in a correct ELP, i.e., $\hat{\sigma} = c \cdot \sigma$ for some non-zero c, one checks whether the number of roots of $\hat{\sigma}$ in in $F_q^*$ equals $\deg(\hat{\sigma})$, and this typically includes exhaustive substitution of all elements of $F_q^*$ in $\hat{\sigma}$.

To avoid such exhaustive substitutions after each update on an edge of the decoding tree, a stopping condition is introduced, i.e., a condition on the so-far Groener basis that has the following properties: (1) It never misses the cases where $\hat{\sigma} = c \cdot \sigma$ for some c; and (2) It might sometimes pass (with low probability) when $\hat{\sigma} \neq c \cdot \sigma$ for all non-zero c.

Let $\hat{\omega} := f_{10}(X) h_{00}(X) + f_{11}(X) h_{10}(X)$. The idea of the stopping condition is that when the condition of part 3 of Theorem 3 holds, $(\hat{\omega}, \hat{\sigma}) = c \cdot (\omega, \sigma)$, and then, if an edge of the decoding tree corresponds to a correct flipping hypothesis, i.e., $\alpha_r$ is indeed an error locator with corresponding error value $\beta_r$, $\Delta_1 = 0$ must be true in both iterations of Algorithm B. Similarly, in case the edge of the decoding tree corresponds to an erasure of a coordinate which contains error, then $\Delta_1 = 0$ is true in the single iteration of Algorithm C.

So, the first criterion for stopping and performing an exhaustive substitution, is that the above discrepancies are zero. A second condition is for screening out cases which is also relevant to a method according to an embodiment, where variable erasures are allowed on top of variable flippings. This criterion will be described as follows, without getting into further details.

The Stopping Condition is Described as Follows:
1. On an edge that corresponds to adding a flip, i.e., when moving from $$N_{r-1,e_0^{(1)},e_0^{(2)}} \text{ to } N_{r,e_0^{(1)},e_0^{(2)}},$$

check if $\Delta_1=0$ for both the root and derivative iterations of Algorithm B. Alternatively, on an edge that corresponds to adding an erasure, i.e., when moving from $$N_{r,e_0^{(1)},e_0^{(2)}-1} \text{ to } N_{r,e_0^{(1)},e_0^{(2)}},$$

check if $\Delta_1=0$ for the single iteration of Algorithm C.
2. If the check of part 1 passes, check that $\hat{\sigma}(X)$, which corresponds to the parent node, either $$N_{r-1,e_0^{(1)},e_0^{(2)}} \text{ or } N_{r,e_0^{(1)},e_0^{(2)}-1},$$

respectively to the case in part 1, and its formal derivative (X) do not have common roots in $\alpha_1, \ldots, \alpha_{r-1}$ in the first case (Algorithm B), or on $\alpha_1, \ldots, \alpha_r$ (Algorithm C).

Efficient Evaluation

Whenever the stopping criterion holds, $\hat{\sigma}(X)$ is evaluated. In some cases, $\hat{\sigma}'(X)$ may also be evaluated. Recalling that $\hat{\sigma}:=f_{10}(X)h_{01}(X)+f_{11}(X)h_{11}(X)$, it holds that $$\hat{\sigma}'(X) = f_{10}(X)h'_{01}(X) + f'_{10}(X)h_{01}(X) + f_{11}(X)h'_{11}(X) + f'_{11}(X)h_{11}(X)$$

Noting that $h_{01}(X)$ and $h_{11}(X)$ are known after calculating the Groebner basis for $$M'_{0,e_0^{(1)},0}$$

as part of the initial errors and erasures decoding, $\hat{\sigma}$ can be efficiently evaluated as follows:
1. After calculating $h_0$, $h_1$ at the initialization step, evaluate and store the values of $h_{01}(\beta)$, $h_{11}(\beta)$, $h_{01}'(\beta)$, and $h_{11}'(\beta)$ for all $\beta \in F_q^*$.
2. Whenever a new $\hat{\sigma}$ is evaluated at some $\beta$, evaluate only the low-degree polynomials $f_{10}(X)$, $f_{11}(X)$, and calculate $\hat{\sigma}(\beta)$ with two additional multiplications, as $\hat{\sigma}(\beta) = f_{10}(\beta) \cdot h_{01}(\beta) + f_{11}(\beta) \cdot h_{11}(\beta)$. Similarly, whenever $\sigma'$ is evaluated, calculate also the evaluations $f_{10}'(\beta)$, $f_{11}'(\beta)$, and calculate $\sigma'(\beta)$ using 4 additional multiplications, using calculated and stored values and the following formula for the estimated value of $\sigma'(X)$:

$$\hat{\sigma}'(X) = f_{10}(X)h'_{01}(X) + f'_{10}(X)h_{01}(X) + f_{11}(X)h'_{11}(X) + f'_{11}(X)h_{11}(X).$$

Embodiment of an Overall Decoding Algorithm on a Tree

This section presents one possible high-level embodiment of an entire decoding process with a new combined fast Chase/GMD algorithm. It should be kept in mind that different embodiments can also be used. For example, instead of using the BM algorithm at the first stage for errors-and-erasures decoding, one can use the algorithm for finding a Groebner basis for $$M'_{0,e_0^{(1)},0}$$

outlined above, or other algorithms.

FIG. 1 is a flow chart of a decoding process with a new combined fast Chase/GMD algorithm according to an embodiment. Referring now to the figure, a decoding process starts at step 10 by receiving a codeword y through a digital electronic communication channel. The codeword $y=x+e$ for at least one error vector $e \in F_q^n$, where $F_q$ is a finite field of q elements, wherein q is a prime power, and for transmitted codeword $x \in C$, wherein C is a generalized Reed-Solomon code with possible shortening, of length $n \leq q-1$ and minimum Hamming distance $d \geq 2$. Hard decision (HD) error-and-erasures decoding is performed on the codeword with a fixed set of erasures, at step 11, and at step 12, it is determined whether the HD error-and-erasures decoding has failed. Upon failure of the HD error-and-erasures decoding, the decoding process further includes finding a Groebner basis to a solution module that accounts for the fixed set of erasures, at step 13, and determining a set of Chase coordinates and a set of generalized minimum distance (GMD) coordinates using channel reliability information, at step 14. At step 15, a Chase and GMD decoding tree is constructed on the set of Chase coordinates and the set of GMD coordinates, and the decoding tree is traversed depth first at step 16, using polynomials of the Groebner basis as a basis that represents updated coefficient polynomials on the Chase and GMD decoding tree. The polynomials on the decoding tree are updated at step 17 using root and derivate steps that flip an edge, or a root step for an erasure edge, and at step 18 error locations are calculated by polynomial evaluation of candidate polynomials from the decoding tree, and error values are calculated. The polynomial evaluation of candidate polynomials includes verifying that a valid pair of EEP and ELP has been found by checking that a number of ELP roots equals its degree minus a number of variables erasures, and the inverses of all roots are outside an erasure set, and calculating error values includes finding error values on non-erased coordinates using Forney's algorithm with the EEP and ELP, and checking that no estimated error value on a non-erased coordinate is zero. The received codeword is corrected at step 20 according to the calculated error locations and calculated error values, and the corrected received codeword is saved to a decoder output list.

An example of a decoding process with a new combined fast Chase/GMD algorithm according to an embodiment is as follows.
1. Perform errors and erasures decoding with the $e_0^{(1)}$ (fixed erasures, e.g., by taking the following steps:
   a. Perform algorithm A
   b. Check if $v(X)$ has $\deg(v(X))$ roots on the non-erased coordinates, i.e., on $F_q^* \backslash A_1'$, and that $\deg(v)=L-e_0^{(1)}$, where L is the estimated order and $L-e_0^{(1)}$ is a corrected order that does not account for erasures.
   c. If the condition in step b holds, then proceed to the following steps:
      i. Define $\sigma_1 := V$
      ii. Calculate $\sigma_E := \sigma_1 \sigma_0^{(1)}$, and $\omega_E = \tilde{S} \sigma_1 \mod (X^{d-1})$.
      iii. Inverses of roots of $\sigma_1$ point to error locations outside $A_1'$. Use Forney's formula to find error values for all these error locations, as well as for the erased coordinates in $A_1'$.
  iv. Using the locations and values from the previous step, correct all errors.
  v. Output the decoded codeword and declare success.
2. If the condition in step 1b fails, then start the fast combined Chase/GMD decoding:
  a. Find a Groebner basis $\{h_0, h_1\}$ from $$M'_{0,e_0^{(1)},0}$$

as described in the initiation step above.
  b. Construct the decoding tree T. Assign memory for $r_{max}+1$ Groebner bases, one for each depth. Store the Groebner basis $\{(1,0), (0,1)\}$ for $$N_{0,e_0^{(1)},0}$$

in the memory of depth 0.
  c. Traverse the tree depth first
    i. When moving on an edge corresponding to moving from $e_0^{(2)}-1$ to $e_0^{(2)}$ such as an edge that corresponds to one additional variable erasure or one additional Chase flip, use Algorithm C for updating the Groebner basis read from the memory of the previous depth. Store the resulting Groebner basis in memory for the current depth, overriding previously stored values, if any.
    ii. When moving on an edge that corresponds to moving from $r-1$ to $r$, use Algorithm B to update the Groebner basis read from memory of the previous depth. Store the resulting Groebner basis in memory for the current depth, overriding previously stored values, if any.
    iii. If during the update the stopping condition holds:
      1. Writing $\{f_0=(f_{00}, f_{01}), f_1=(f_{10}, f_{11})\}$ for the original Groebner basis on the parent node, check if $(\widehat{\omega_E}, \hat{\sigma}) = c(\omega_E, \sigma_1\sigma_0^{(2)})$ holds for some $c \neq 0$, where $\widehat{\omega_E} = f_{10}(X)h_{00}(X) + f_{11}(X)h_{10}(X)$ and $\hat{\sigma} := f_{10}(X)h_{01}(X) + f_{11}(X)h_{11}(X)$, as follows:
        a. Find all the roots of $\hat{\sigma}$ on inverses of elements from $F_q^* \setminus (A_1' \cup A_2')$, using the fast evaluation methods defined above. Verify that the number of these roots is exactly $\deg(\hat{\sigma}) - e_0^{(2)}$. If not, declare that the stopping condition was falsely positive, and return to the depth-first search on the tree.
        b. Calculate $\widehat{\sigma_E} = \hat{\sigma} \cdot \sigma_0^{(1)}$ and find error values only on non-erased coordinates, i.e., coordinates with locators in $F_q^* \setminus (A_1' \cup A_2')$, by using Forney's formula for $(\hat{\omega}_E, \hat{\sigma}_E)$. If at least one of error value turns out to be 0, declare that the stopping condition was falsely positive, and return to the depth-first search on the tree.
        2. Calculate error values for all $e_0^{(1)} + e_0^{(2)}$ erased coordinates using Forney's formula (these values may be either zero or non-zero).
        3. Correct the received codeword according to the calculated error locations and values, and save to the output list of the decoder. Return to the tree search to find potential additional decoded codewords in the output list of the decoder.

Note that in some embodiments, the maximum list size may be bounded by some integer parameter $L \geq 1$. In such embodiments, the search stops once the list reaches a size of L.

Figure 3:
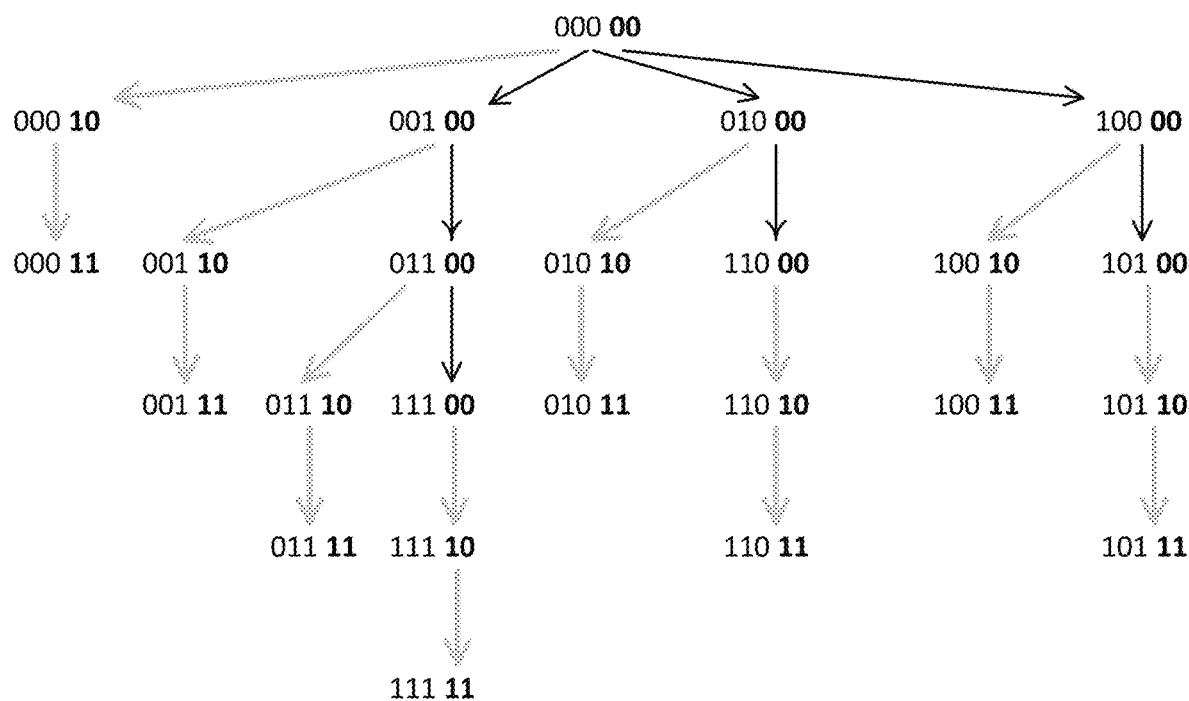
FIG. 3 shows an example of a variant of the decoding tree, according to an embodiment of the disclosure.

FIG. 3 shows an example of a variant of the decoding tree. Here, $I_{Chase}$ has 3 coordinates, and the left triple of each vertex in the figure represents "do not flip/flip" (0/1, respectively) for each coordinate in $I_{Chase}$. In addition, $I_{GMD}$ has 2 coordinates, and the right pair of each vertex in the figure represents "do not erase/erase" (0/1, respectively) for each coordinate in $I_{GMD}$. The thin black edges correspond to Chase flips, while thick gray edges correspond to GMD erasures. In this example, since there are only 2 GMD coordinates, constructing the decoding tree reduces to first constructing the "only black edges tree", where there are only Chase flips without any erasures, and then, for each vertex, adding two successive GMD erasure edges, ending in a vertex with identical flipping values on $I_{chase}$, but with the two GMD coordinates erased.

FINAL REMARKS: SOME ADDITIONAL EMBODIMENTS

In an embodiment, it is not mandatory to restrict the Chase decoding to 2 error hypotheses per coordinate. In general, it is possible to choose any number of hypotheses between 2 and q per coordinate, and this gives a tradeoff between complexity and probability of decoding success.

In addition, in an embodiment, it is not mandatory to use two disjoint sets for variable erasures (GMD) and for Chase decoding. For example, it is possible to have coordinates on which it is attempted to both try both various error values and erasure. For example, in most of the text above, two error values were considered for a coordinate in Chase decoding, say, 0 and $\beta$, where $\beta$ is the second most likely error for the coordinate. However, it is also possible to add the value "erased" for this coordinate, i.e., the possibilities are now $\{0, \beta, \text{erased}\}$. If on some edge of the decoding tree the value changes from 0, $\beta$, use Algorithm B for the update, while if the value changes from 0 to erased, use Algorithm C for the update.

System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

Figure 2:
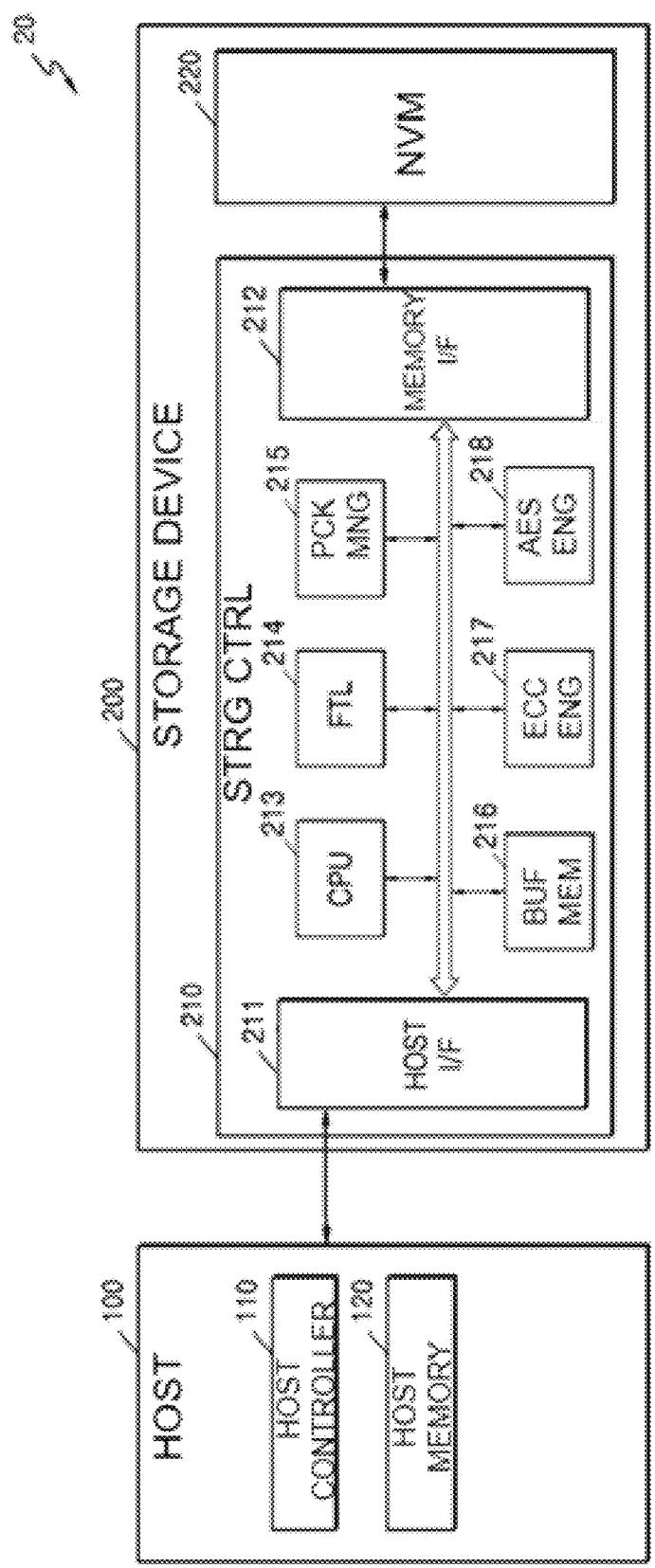
FIG. 2 is a block diagram of a system for performing a decoding process with a new combined fast Chase/GMD algorithm, according to an embodiment of the disclosure.

FIG. 2 is a block diagram of a host storage system 20 that includes an error correction circuit that performs a fast combined chase and GMD decoding of generalized Reed-Solomon codes, according to an embodiment.

The host storage system 20 includes a host 100 and a storage device 200. Further, the storage device 200 includes a storage controller 210 and an NVM 220. According to an embodiment, the host 100 includes a host controller 110 and a host memory 120. The host memory 120 can serve as a buffer memory that temporarily stores data to be transmitted to the storage device 200 or data received from the storage device 200.

The storage device 200 includes storage media that stores data in response to requests from the host 100. For example, the storage device 200 includes at least one of an SSD, an embedded memory, and/or a removable external memory. When the storage device 200 is an SSD, the storage device 200 conforms to an NVMe standard. When the storage device 200 is an embedded memory or an external memory, the storage device 200 conforms to a UFS standard or an eMMC standard. Each of the host 100 and the storage device 200 generates a packet according to an adopted standard protocol and transmit the packet.

When the NVM 220 of the storage device 200 includes a flash memory, the flash memory may include a 2D NAND memory array or a 3D (or vertical) NAND (VNAND) memory array. For example, the storage device 200 can include various other kinds of NVMs. For example, the storage device 200 includes at least one of a magnetic RAM (MRAM), a spin-transfer torque MRAM, a conductive bridging RAM (CBRAM), a ferroelectric RAM (FRAM), a PRAM, an RRAM, or various other kinds of memories.

According to an embodiment, the host controller 110 and the host memory 120 are implemented as separate semiconductor chips. Alternatively, in some embodiments, the host controller 110 and the host memory 120 are integrated in the same semiconductor chip. For example, the host controller 110 is one of a plurality of modules included in an application processor (AP). The AP can be implemented as a System on Chip (SoC). Further, the host memory 120 may be an embedded memory included in the AP or an NVM or memory module located outside the AP.

The host controller 110 manages an operation of storing data, such as write data, of a buffer region of the host memory 120 in the NVM 220 or an operation of storing data, such as read data, of the NVM 220 in the buffer region.

The storage controller 210 includes a host interface 211, a memory interface 212, and a CPU 213. Further, the storage controllers 210 furthers include a flash translation layer (FTL) 214, a packet manager 215, a buffer memory 216, an error correction code (ECC) engine 217, and an advanced encryption standard (AES) engine 218. The storage controllers 210 further includes a working memory in which the FTL 214 is loaded. The CPU 213 executes the FTL 214 to control data write and read operations on the NVM 220.

The host interface 211 transmits and receives packets to and from the host 100. A packet transmitted from the host 100 to the host interface 211 includes a command or data to be written to the NVM 220. A packet transmitted from the host interface 211 to the host 100 includes a response to the command or data read from the NVM 220. The memory interface 212 transmits data to be written to the NVM 220 to the NVM 220 or receives data read from the NVM 220. The memory interface 212 complies with a standard protocol, such as Toggle or open NAND flash interface (ONFI).

The FTL 214 performs various functions, such as an address mapping operation, a wear-leveling operation, and a garbage collection operation. The address mapping operation converts a logical address received from the host 100 into a physical address used to actually store data in the NVM 220. The wear-leveling operation prevents excessive deterioration of a specific block by allowing blocks of the NVM 220 to be uniformly used. For example, the wear-leveling operation can be implemented using a firmware technique that balances erase counts of physical blocks. The garbage collection operation ensures usable capacity in the NVM 220 by erasing an existing block after copying valid data of the existing block to a new block.

The packet manager 215 generates a packet according to a protocol of an interface that consents to the host 100, or parses various types of information from the packet received from the host 100. In addition, the buffer memory 216 temporarily stores data to be written to the NVM 220 or data to be read from the NVM 220. Although the buffer memory 216 may be included in the storage controllers 210, the buffer memory 216 may be outside the storage controllers 210.

The ECC engine 217 performs error detection and correction operations on read data read from the NVM 220. More specifically, the ECC engine 217 generates parity bits for write data to be written to the NVM 220, and the generated parity bits are stored in the NVM 220 together with write data. During the reading of data from the NVM 220, the ECC engine 217 corrects an error in the read data by using the parity bits read from the NVM 220 along with the read data, and outputs error-corrected read data. The ECC engine 217 performs error correction using a fast combined chase and GMD decoding of generalized Reed-Solomon codes according to embodiments as described above, and may be implemented as an application specific integrated circuit.

The AES engine 218 performs at least one of an encryption operation and/or a decryption operation on data input to the storage controllers 210 by using a symmetric-key algorithm.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

What is claimed is:

1. A method for soft decoding of generalized Reed-Solomon (RS) error correction codes, comprising:

receiving a signal comprising a codeword y through a digital electronic communication channel, wherein y=x+e for at least one error vector $e \in F_q^n$, where $F_q$ is a finite field of q elements, wherein q is a prime power, and for transmitted codeword $x \in C$, wherein C is a generalized Reed-Solomon code having a length n<=q−1 configured to be shortened and a minimum Hamming distance d≥2;

performing hard decision (HD) error-and-erasures decoding on the codeword with a fixed set of erasures;

verifying that the HD error-and-erasures decoding has failed;

finding a Groebner basis to a solution module that accounts for a fixed set of erasures;

determining a set of Chase coordinates and a set of generalized minimum distance (GMD) coordinates using channel reliability information;

constructing a Chase and GMD decoding tree on the set of Chase coordinates and the set of GMD coordinates;

traversing the decoding tree depth first using polynomials of the Groebner basis as a basis that represents updated coefficient polynomials on the Chase and GMD decoding tree;

updating polynomials on the decoding tree using root and derivate steps that flip an edge, or a root step for an erasure edge;

calculating error locations by polynomial evaluation of candidate polynomials from the decoding tree, and calculating error values; and correcting the received codeword according to the calculated error locations and calculated error values, and saving the corrected received codeword to a decoder output list.

2. The method of claim 1, wherein performing hard decision (HD) error-and-erasures decoding with a fixed set of erasures comprises:

calculating an estimated error location polynomial (ELP) v(X) that excludes erasures by performing an errors and erasures Berlekamp-Massey algorithm, wherein X is an indeterminate variable;

verifying that v(X) has deg (v(X)) inverses of roots on coordinates $F_q^* \backslash A_1'$ that are not fixed erasures, wherein $F_q^* = F_q \backslash \{0\}$ and $A_1'$ is a set of fixed erasures, and that $\deg(v) = L - e_0^{(1)}$, wherein L is an estimated order, $e_0^{(1)}$ is a number of fixed erasures and $L - e_0^{(1)}$ is a corrected order that excludes erasures;

defining $\sigma_1 := v$;

calculating an errors and fixed erasures ELP $\sigma_E := \sigma_1 \sigma_0^{(1)}$, wherein $\sigma_0^{(1)}$ is an erasure locating polynomial, and an errors and fixed erasures error evaluation polynomial (EEP) $\omega_E = \tilde{S} \sigma_1 \mod (X^{d-1})$, wherein $\tilde{S}$ is a syndrome polynomial associated with y and the set of fixed erasures;

finding error values for error locations outside $A_1'$, by using Forney's formula with roots of $\sigma_1$; and error values for error locations in $A^{1'}$, by using Forney's formula with the inverses of elements of $A_1'$;

correcting all errors in a decoded codeword using the found error values; and outputting a corrected decoded codeword.

3. The method of claim 2, wherein verifying that the HD error-and-erasures decoding has failed comprises verifying that v(X) does not have deg (v(X)) roots on inverses of non-erased coordinates, or that $\deg(v) \neq L - e_0^{(1)}$.

4. The method of claim 1, wherein constructing a decoding tree includes assigning memory for $r_{max}+1$ Groebner bases, one for each depth, where $r_{max}$ is a maximum designed depth, and storing the Groebner basis $\{(1,0), (0,1)\}$ for a module of coefficient polynomials $$N_{0, e_0^{(1)}, 0}$$

for a case of only fixed erasures in memory of depth 0, wherein the decoding tree includes a root that is an all zero vector in $F_2^\eta$, vertices that at depth r, for all $r \in \{1, \ldots, r_{max}\}$, are vectors of length $\eta$ and weight r in $F_2^\eta$, and edges that are pairs $(\beta', \beta)$, wherein $\eta$ is a number of Chase flipping coordinates plus a number of variable GMD erasure coordinates, wherein for each vertex $\beta = (\beta_1, \ldots, \beta_\eta) \in F_2^\eta$ at depth r with non-zero entries at coordinates $i_1, \ldots, i_r$, a single vertex $\beta' = (\beta_1', \ldots, \beta_\eta')$ is selected at depth r−1 that is equal to $\beta$ on all coordinates, except for one additional flipped or erased coordinate $i_l$, $l \in \{1, \ldots, r\}$ in an edge, for which $\beta_{i_l}' = 0$.

5. The method of claim 1, wherein traversing the decoding tree depth first comprises updating a Groebner basis read from a memory of a previous depth when moving on an edge that corresponds to one additional variable erasure or one additional Chase flip, wherein the updated Groebner basis is stored in memory.

6. The method of claim 5, wherein updating the Groebner basis read from the memory of the previous depth comprises using Koetter's iteration that deletes an additional coordinate when moving on an edge that corresponds to one additional variable erasure or using a pair of Koetter's iterations when moving on an edge that corresponds to a Chase flip on an additional coordinate.

7. The method of claim 1, the method further comprising:

verifying that, during an update of the Groebner basis, a stopping condition holds;

outputting that the stopping condition was falsely positive, and returning to the depth-first search of the tree, when a number of roots of $\hat{\sigma}$ whose inverses are not on a fixed or variable erasure is not $\deg(\hat{\sigma}) - e_0^{(2)}$, wherein $\hat{\sigma}$ is a set of estimated errors and variable erasures ELP, and $e_0^{(2)}$ is a number of variable erasures.

8. The method of claim 1, the method further comprising:

verifying that, during an update of the Groebner basis, a stopping condition holds;

outputting that the stopping condition was falsely positive, and returning to the depth-first search on the tree, when at least one of error values found on coordinates with locators in the non-erased coordinates $F_q^* \backslash (A_1' \cup A_2')$ equal 0, wherein $F_q^* := F_q \backslash \{0\}$, $A_1'$ is a set of fixed erasures and $A_2'$ is a current hypothesis of variable erasures.

9. The method of claim 1, wherein calculating error locations by polynomial evaluation of candidate polynomials from the decoding tree, and calculating error values by using Forney's formula, comprises:

verifying that a valid pair of an EEP and an ELP has been found by checking that a number of ELP roots equals its degree minus a number of variables erasures, and the inverses of all roots are outside a fixed erasure set, finding error values on non-erased coordinates using Forney's algorithm with the EEP and ELP, and checking that no estimated error value on a non-erased coordinate is zero;

calculating an estimated errors and erasures ELP $\widehat{\sigma_E} := \hat{\sigma} \cdot \sigma_0^{(1)}$, wherein $\hat{\sigma}$ is a set of estimated errors and variable erasures ELP and $\sigma_0^{(1)}$ is a fixed erasures ELP, and finding error values only on coordinates with locators in $F_q^* \backslash (A_1' \cup A_2')$ by using Forney's formula, wherein $F_q' := F_q \backslash \{0\}$, $A_1'$ is a set of fixed erasures and $A_2'$ is a current hypothesis of variable erasures and calculating error values for all $e_0^{(1)} + e_0^{(2)}$ erased coordinates by using Forney's formula, wherein $e_0^{(2)}$ is a number of variable erasures.

10. The method of claim 9, wherein finding all the roots of $\hat{\sigma}$ on inverses of elements from $F_q^* \backslash (A_1' \cup A_2')$ comprises:

evaluating and storing values of $h_{01}(\beta)$, $h_{11}(\beta)$, $h_{01}'(\beta)$, and $h_{11}'(\beta)$ for all coordinates $\beta \in F_q^*$, wherein $h_{01}$ and $h_{11}$ are second polynomials from of the Groebner basis of the solution module for an errors and fixed erasures key equation;

calculating $\hat{\sigma}(\beta) = f_{10}(\beta) \cdot h_{01}(\beta) + f_{11}(\beta) \cdot h_{11}(\beta)$ for a new set of estimated errors $\hat{\sigma}$, wherein $f_{10}$ and $f_{11}$ are individual polynomials from the current Groebner basis for the solution module of coefficient polynomials; and calculating a derivative of the ELP $\sigma'(\beta)$ by evaluating derivatives $f_{10}'(\beta)$, $f_{11}'(\beta)$, and calculating $\sigma'(\beta)$ using 4 additional multiplications, using calculated and stored values and a following formula for an estimated value of $\sigma'(X)$:

$$\hat{\sigma}'(X) = f_{10}(X)h_{01}'(X) + f_{10}'(X)h_{01}(X) + f_{11}(X)h_{11}'(X) + f_{11}'(X)h_{11}(X).$$

11. A digital electronic circuit, tangibly embodying a program of instructions executed by the digital electronic circuit to perform method steps for soft decoding of generalized Reed-Solomon (RS) error correction codes, the method steps comprising:

receiving a signal comprising a codeword y through a digital electronic communication channel, wherein y=x+e for at least one error vector $e \in F_q^n$, where $F_q$ is a finite field of q elements, wherein q is a prime power, and for transmitted codeword $x \in C$, wherein C is a generalized Reed-Solomon code of length n<=q−1 and that is configured to be shortened and minimum Hamming distance d≥2;

performing hard decision (HD) error-and-erasures decoding on the codeword with a fixed set of erasures;

verifying that the HD error-and-erasures decoding has failed;

finding a Groebner basis to a solution module that accounts for the fixed set of erasures;

determining a set of Chase coordinates and a set of generalized minimum distance (GMD) coordinates using channel reliability information;

constructing a Chase and GMD decoding tree on a set of Chase coordinates and the set of GMD coordinates;

traversing the decoding tree depth first using polynomials of the Groebner basis as a basis that represents updated coefficient polynomials on the Chase and GMD decoding tree;

updating polynomials on the decoding tree using root and derivate steps that flip an edge, or a root step for an erasure edge;

calculating error locations by polynomial evaluation of candidate polynomials from the decoding tree, and calculating error values; and correcting the received codeword according to the calculated error locations and calculated error values, and saving the corrected received codeword to a decoder output list.

12. The digital electronic circuit of claim 11, wherein performing hard decision (HD) error-and-erasures decoding with a fixed set of erasures comprises:

calculating an estimated error location polynomial (ELP) v(X) that excludes erasures by performing an errors and erasures Berlekamp-Massey algorithm, wherein X is an indeterminate variable;

verifying that v(X) has deg (v(X)) inverses of roots on coordinates $F_q^* \backslash A_1'$ that are not fixed erasures, wherein $F_q^* = F_q \backslash \{0\}$ and $A_1'$ is a set of fixed erasures, and that $\deg(v) = L - e_0^{(1)}$, wherein L is an estimated order, $e_0^{(1)}$ is a number of fixed erasures and $L - e_0^{(1)}$ is a corrected order that excludes erasures;

defining $\sigma_1 := v$;

calculating an errors and fixed erasures ELP $\sigma_E := \sigma_0 \sigma_0^{(1)}$, wherein $\sigma_0^{(1)}$ is an erasure locating polynomial, and an errors and fixed erasures error evaluation polynomial (EEP) $\omega_E = \check{S} \sigma_1 \mod(X^{d-1})$, wherein $\check{S}$ is a syndrome polynomial associated with y and the set of fixed erasures;

finding error values for error locations outside $A_1'$, by using Forney's formula with roots of $\sigma_1$; and error values for error locations in $A_1'$, by using Forney's formula with the inverses of elements of $A_1'$;

correcting all errors in a decoded codeword using the found error values; and outputting a corrected decoded codeword.

13. The digital electronic circuit of claim 12, wherein verifying that the HD error-and-erasures decoding has failed comprises verifying that v(X) does not have deg (v(X)) roots on inverses of non-erased coordinates, or that $\deg(v) \neq L - e_0^{(1)}$.

14. The digital electronic circuit of claim 11, wherein constructing a decoding tree includes assigning memory for $r_{max}+1$ Groebner bases, one for each depth, where $r_{max}$ is a maximum designed depth, and storing the Groebner basis $\{(1,0), (0,1)\}$ for a module of coefficient polynomials $$N_{0,e_0^{(1)},0}$$

for a case or only fixed erasures in a memory of depth 0, wherein the decoding tree includes a root that is an all zero vector in $F_2^n$, vertices that at depth r, for all $r \in \{1, \ldots, r_{max}\}$, are vectors of length n and weight r in $F_2^n$, and edges that are pairs $(\beta', \beta)$, wherein $\eta$ is a number of Chase flipping coordinates plus a number of variable GMD erasure coordinates, wherein for each vertex $\beta = (\beta_1, \ldots, \beta_n) \in F_2^n$ at depth r with non-zero entries at coordinates $i_1, \ldots, i_r$, a single vertex $\beta' = (\beta_1', \ldots, \beta_n')$ is selected at depth r−1 that is equal to $\beta$ on all coordinates, except for one additional flipped or erased coordinate $i_l$, $l \in \{1, \ldots, r\}$ in an edge, for which $\beta_{i_l}' = 0$.

15. The digital electronic circuit of claim 11, wherein traversing the decoding tree depth first comprises updating a Groebner basis read from a memory of a previous depth when moving on an edge that corresponds to one additional variable erasure or one additional Chase flip, wherein the updated Groebner basis is stored in memory.

16. The digital electronic circuit of claim 15, wherein updating the Groebner basis read from the memory of the previous depth comprises using Koetter's iteration that deletes an additional coordinate when moving on an edge that corresponds to one additional variable erasure or using a pair of Koetter's iterations when moving on an edge that corresponds to a Chase flip on an additional coordinate.

17. The digital electronic circuit of claim 11, wherein the method steps further comprise:

verifying that, during an update of the Groebner basis, a stopping condition holds;

outputting that the stopping condition was falsely positive, and returning to the depth-first search of the tree, when a number of roots of $\hat{\sigma}$ whose inverses are not on a fixed or variable erasure is not $\deg(\hat{\sigma}) - e_0^{(2)}$, wherein $\hat{\sigma}$ is a set of estimated errors and variable erasures ELP, and $e_0^{(2)}$ is a number of variable erasures.

18. The digital electronic circuit of claim 11, wherein the method steps further comprise:

verifying that, during an update of the Groebner basis, a stopping condition holds;

outputting that the stopping condition was falsely positive, and returning to the depth-first search on the tree, when at least one of error values found on coordinates with locators in the non-erased coordinates $F_q^* \backslash (A_1' \cup A_2')$ equal 0, wherein $F_q^* := F_q \backslash \{0\}$, $A_1'$ is a set of fixed erasures and $A_2'$ is a current hypothesis of variable erasures.

19. The digital electronic circuit of claim 11, wherein calculating error locations by polynomial evaluation of candidate polynomials from the decoding tree, and calculating error values by using Forney's formula, comprises:

verifying that a valid pair of EEP and ELP has been found by checking that a number of ELP roots equals its degree minus a number of variables erasures, and the inverses of all roots are outside a fixed erasure set, finding error values on non-erased coordinates using Forney's algorithm with the EEP and ELP, and checking that no estimated error value on a non-erased coordinate is zero;

calculating an estimated errors and erasures ELP $\widehat{\sigma_E} := \hat{\sigma} \cdot \sigma_0^{(1)}$, wherein $\hat{\sigma}$ is a set of estimated errors and variable erasures ELP and $\sigma_0^{(1)}$ is a fixed erasures ELP, and finding error values only on coordinates with locators in $F_q^* \backslash (A_1' \cup A_2')$ by using Forney's formula wherein $F_q^* := F_q \backslash \{0\}$, $A_1'$ is a set of fixed erasures and $A_2'$ is a current hypothesis of variable erasures, and calculating error values for all $e_0^{(1)} + e_0^{(2)}$ erased coordinates by using Forney's formula, wherein $e_0^{(2)}$ is a number of variable erasures.

20. The digital electronic circuit of claim 19, wherein finding all the roots of $\hat{\sigma}$ on inverses of elements from $F_q^* \backslash (A_1' \cup A_2')$ comprises:

evaluating and storing values of $h_{01}(\beta)$, $h_{11}(\beta)$, $h_{01}'(\beta)$, and $h_{11}'(\beta)$ for all coordinates $\beta \in F_q^*$, wherein $h_{01}$ and $h_{11}$ are second polynomials from of the Groebner basis of the solution module for an errors and fixed erasures key equation;

calculating $\hat{\sigma}'(\beta) = f_{10}(B) \cdot h_{01}(\beta) + f_{11}(\beta) \cdot h_{11}(\beta)$ for a new set of estimated errors $\hat{\sigma}$, wherein $f_{10}$ and $f_{11}$ are individual polynomials from the current Groebner basis for the solution module of coefficient polynomials; and calculating a derivative of the ELP $\Gamma'(\beta)$ by evaluating derivatives $f_{10}'(\beta)$, $f_{11}'(\beta)$, and calculating $\hat{\sigma}'(\beta)$ using 4 additional multiplications, using calculated and stored values and a following formula for an estimated value of $\hat{\sigma}'$ (X):

$$\hat{\sigma}'(X) = f_{10}(X) h_{01}'(X) + f_{10}'(X) h_{01}(X) + f_{11}(X) h_{11}'(X) + f_{11}'(X) h_{11}(X).$$

\* \* \* \* \*